United States Patent
Tokunaga et al.

(10) Patent No.: US 10,014,414 B2
(45) Date of Patent: Jul. 3, 2018

(54) SEMICONDUCTOR DEVICE AND METHOD FOR MANUFACTURING THE SAME

(71) Applicant: Semiconductor Energy Laboratory Co., Ltd., Kanagawa-ken (JP)

(72) Inventors: Hajime Tokunaga, Kanagawa (JP); Takuya Handa, Tochigi (JP); Kenichi Okazaki, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 784 days.

(21) Appl. No.: 14/190,874

(22) Filed: Feb. 26, 2014

(65) Prior Publication Data

US 2014/0239296 A1    Aug. 28, 2014

(30) Foreign Application Priority Data

Feb. 28, 2013    (JP) ................. 2013-038596

(51) Int. Cl.
*H01L 29/786*    (2006.01)
*H01L 29/66*    (2006.01)

(52) U.S. Cl.
CPC .... *H01L 29/7869* (2013.01); *H01L 29/66742* (2013.01); *H01L 29/66969* (2013.01)

(58) Field of Classification Search
CPC ..................................... H01L 21/00
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| EP | 1737044 A | 12/2006 |
| EP | 1 976 018 A2 | 10/2008 |

(Continued)

OTHER PUBLICATIONS

Nakayama, Y.I. et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — Marvin Payen

(74) *Attorney, Agent, or Firm* — Husch Blackwell LLP

(57) ABSTRACT

A transistor or the like having high field-effect mobility is provided. A transistor or the like having stable electrical characteristics is provided. A semiconductor device including a first oxide semiconductor layer, a second oxide semiconductor layer, a gate insulating film, and a gate electrode which partly overlap with one another is provided. The second oxide semiconductor layer is positioned between the first oxide semiconductor layer and the gate insulating film. The gate insulating film is positioned between the second oxide semiconductor layer and the gate electrode. The first oxide semiconductor layer has fewer oxygen vacancies than those of the second oxide semiconductor layer.

12 Claims, 21 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,058,647 B2 | 11/2011 | Kuwabara et al. |
| 8,148,779 B2 | 4/2012 | Jeong et al. |
| 8,178,926 B2 | 5/2012 | Nakayama |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,298,858 B2 | 10/2012 | Kuwabara et al. |
| 8,344,387 B2 | 1/2013 | Akimoto et al. |
| 8,518,755 B2 | 8/2013 | Yamazaki et al. |
| 8,546,182 B2 | 10/2013 | Akimoto et al. |
| 8,547,771 B2 | 10/2013 | Koyama |
| 8,552,434 B2 | 10/2013 | Akimoto et al. |
| 8,728,883 B2 | 5/2014 | Yamazaki et al. |
| 8,748,887 B2 | 6/2014 | Kuwabara et al. |
| 9,112,038 B2 | 8/2015 | Kuwabara et al. |
| 9,281,358 B2 | 3/2016 | Yamazaki et al. |
| 9,419,113 B2 | 8/2016 | Asano et al. |
| 9,559,212 B2 | 1/2017 | Kuwabara et al. |
| 9,634,082 B2 | 4/2017 | Yamazaki et al. |
| 9,722,054 B2 | 8/2017 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0225543 A1 | 9/2012 | Ohno et al. |
| 2012/0305913 A1 | 12/2012 | Yamazaki et al. |
| 2013/0009220 A1* | 1/2013 | Yamazaki ......... H01L 29/78696 257/288 |
| 2013/0161608 A1 | 6/2013 | Yamazaki |
| 2013/0320330 A1 | 12/2013 | Yamazaki |
| 2013/0320334 A1 | 12/2013 | Yamazaki et al. |
| 2013/0334523 A1 | 12/2013 | Yamazaki |
| 2013/0334533 A1 | 12/2013 | Yamazaki |
| 2014/0001465 A1 | 1/2014 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2009-212497 A | 9/2009 |
| JP | 2009-231613 | 10/2009 |
| JP | 2010-016347 | 1/2010 |
| JP | 4415062 B1 | 2/2010 |
| JP | 2010-067954 | 3/2010 |
| JP | 2010-141304 A | 6/2010 |
| JP | 2010-177431 | 8/2010 |
| JP | 4571221 B1 | 10/2010 |
| JP | 2011-003775 A | 1/2011 |
| JP | 2011-009724 A | 1/2011 |
| JP | 2012-059860 | 3/2012 |
| JP | 2012-059860 A | 3/2012 |
| JP | 2012-134467 A | 7/2012 |
| JP | 2012-160679 | 8/2012 |
| JP | 2012-257187 | 12/2012 |
| TW | 201025616 | 7/2010 |
| WO | WO-2004/114391 | 12/2004 |
| WO | WO 2008/133345 A1 | 11/2008 |
| WO | WO 2012/073918 A1 | 6/2012 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al,, "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et at., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the ELectrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et at.. "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett, (Physical Review Letters), Jul. 31, 2000, vol. 85, No. 5, pp. 1012-1015.

Taiwanese Office Action re Application No. TW 103104718, dated Jan. 18, 2018.

\* cited by examiner

SEMICONDUCTOR DEVICE AND METHOD FOR MANUFACTURING THE SAME

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor layer, a semiconductor device, a display device, a liquid crystal display device, or a light-emitting device. In addition, the present invention relates to a method for manufacturing a semiconductor device, a display device, a liquid crystal display device, or a light-emitting device. Alternatively, the present invention relates to a driving method of a semiconductor device, a display device, a liquid crystal display device, or a light-emitting device. In particular, the present invention relates to a semiconductor device, a display device, or a light-emitting device each including a transistor, or a driving method thereof, for example. Further, the present invention relates to, for example, an electronic device including the semiconductor device, the display device, or the light-emitting device.

Note that in this specification, a semiconductor device refers to any device that can function by utilizing semiconductor characteristics, and an electro-optical device, a semiconductor circuit, an electronic device, and the like are all included in the category of the semiconductor device.

2. Description of the Related Art

A technique by which a transistor is formed using a semiconductor layer formed over a substrate having an insulating surface has been attracting attention. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferable to use an amorphous silicon film, which can be formed using the established technique for forming a film on a large-sized substrate. On the other hand, in the case of a transistor included in a high-performance display device where driver circuits are formed over the same substrate, it is preferable to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention. For example, a transistor which includes an amorphous oxide semiconductor film containing indium, gallium, and zinc is disclosed (see Patent Document 1).

An oxide semiconductor film can be formed by a sputtering method or the like, and thus can be used for a channel formation region of a transistor in a large display device. A transistor including an oxide semiconductor film has a high field-effect mobility; therefore, a high-performance display device where driver circuits are formed over the same substrate can be obtained. Moreover, there is an advantage that capital investment can be reduced because part of production equipment for a transistor including an amorphous silicon film can be retrofitted and utilized.

A transistor including an oxide semiconductor film is known to have extremely low leakage current in an off state. For example, a CPU or the like with low-power consumption utilizing the low leakage current of the transistor including an oxide semiconductor film is disclosed (see Patent Document 2).

Patent Document 3 discloses that a transistor having high field-effect mobility can be obtained by a well potential formed using an active layer formed of oxide semiconductor layers.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

SUMMARY OF THE INVENTION

One object of the present invention is to provide a transistor or the like having high field-effect mobility. Another object is to provide a transistor or the like having stable electrical characteristics.

Another object is to provide a transistor or the like having low off-state current.

Another object is to provide a semiconductor device or the like including the transistor or the like. Another object is to provide a novel semiconductor device or the like.

Another object is to provide a semiconductor device or the like with high productivity. Another object is to provide a semiconductor device or the like which can be manufactured at low cost. Another object is to provide a semiconductor device or the like with high yield.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a semiconductor device including a first oxide semiconductor layer, a second oxide semiconductor layer, a gate insulating film, and a gate electrode which partly overlap with one another. The second oxide semiconductor layer is positioned between the first oxide semiconductor layer and the gate insulating film. The gate insulating film is positioned between the second oxide semiconductor layer and the gate electrode. The first oxide semiconductor layer has fewer oxygen vacancies than those of the second oxide semiconductor layer.

Another embodiment of the present invention is a semiconductor device including a first oxide semiconductor layer, a second oxide semiconductor layer, a third oxide semiconductor layer, a gate insulating film, and a gate electrode which partly overlap with one another. The third oxide semiconductor layer is positioned between the second oxide semiconductor layer and the gate insulating film. The second oxide semiconductor layer is positioned between the first oxide semiconductor layer and the third oxide semiconductor layer. The gate insulating film is positioned between the third oxide semiconductor layer and the gate electrode. The second oxide semiconductor layer has more oxygen vacancies than those of the first and third oxide semiconductor layers.

Another embodiment of the present invention is a method for manufacturing a semiconductor device including the following steps: forming a first oxide semiconductor layer; forming a second oxide semiconductor layer over the first oxide semiconductor layer; forming a gate insulating film over the second oxide semiconductor layer; and forming a gate electrode over the gate insulating film. The first oxide semiconductor layer is formed by a sputtering method under an atmosphere containing oxygen. The second oxide semiconductor layer is formed by a sputtering method under an atmosphere not containing oxygen.

Another embodiment of the present invention is a method for manufacturing a semiconductor device including the following steps: forming a first oxide semiconductor layer; forming a second oxide semiconductor layer over the first oxide semiconductor layer; forming a third oxide semiconductor layer over the second oxide semiconductor layer; forming a gate insulating film over the third oxide semiconductor layer; and forming a gate electrode over the gate insulating film. The first and third oxide semiconductor layers are formed by a sputtering method under an atmosphere containing oxygen. The second oxide semiconductor layer is formed by a sputtering method under an atmosphere not containing oxygen.

In the semiconductor device of one embodiment of the present invention, for example, the first oxide semiconductor layer and the second oxide semiconductor layer are preferably formed using the same target.

In the semiconductor device of one embodiment of the present invention, for example, the first oxide semiconductor layer and the second oxide semiconductor layer are preferably formed using targets having similar atomic ratios.

A transistor or the like having high field-effect mobility can be provided. A transistor or the like having stable electrical characteristics can be provided.

A transistor or the like having low off-state current can be provided.

A semiconductor device or the like including the transistor or the like can be provided. A novel semiconductor device or the like can be provided.

A semiconductor device or the like with high productivity can be provided. A semiconductor device or the like which can be manufactured at low cost can be provided. A semiconductor device or the like with high yield can be provided.

BRIEF DESCRIPTION OF THE DRAWINGS

FIGS. 1B1 and 1B2 illustrate band structures of the cross-sectional view in FIG. 1A.

FIGS. 2B1 and 2B2 illustrate band structures of the cross-sectional view in FIG. 2A.

DETAILED DESCRIPTION OF THE INVENTION

Figure 1A:
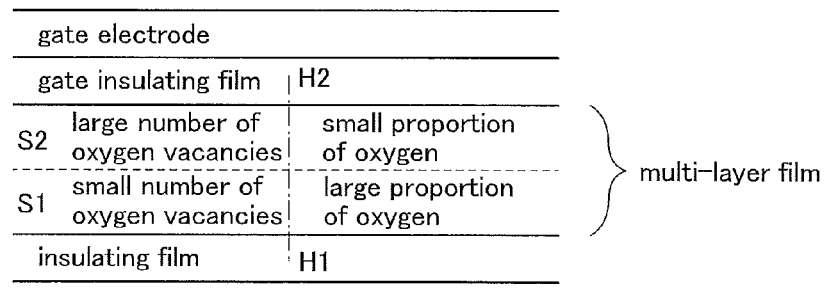
FIG. 1A is a cross-sectional view of part of a transistor of one embodiment of the present invention.

An embodiment of the present invention is described in detail below with reference to the drawings. However, the present invention is not limited to the description below, and it is easily understood by those skilled in the art that modes and details can be modified in various ways. Further, the present invention is not construed as being limited to description of the embodiment and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that what is described (or part thereof) in one embodiment can be applied to, combined with, or exchanged with another content in the same embodiment.

Note that the size, the thickness of layers, or regions in drawings is sometimes exaggerated for simplicity. Therefore, the embodiment of the present invention are not limited to such a scale.

Note that drawings are schematic views of ideal examples, and the embodiment of the present invention are not limited to the shape or the value illustrated in the drawings. For example, the following can be included: variation in shape due to a manufacturing technique; variation in shape due to an error; variation in signal, voltage, or current due to noise; variation in signal, voltage, or current due to a difference in timing; or the like.

A voltage usually refers to a potential difference between a given potential and a reference potential (e.g., a source potential or a ground potential (GND)). Thus, a voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. In addition, the ordinal numbers in this specification do not denote particular names which specify the present invention.

In this specification, for example, when the shape of an object is described with the use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration lower than 0.1 atomic % is an impurity. When an impurity is contained, carrier traps may be formed in the semiconductor, the carrier mobility may be decreased, or the crystallinity may be lowered, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor is an oxide semiconductor, oxygen vacancies may be formed by entry of an impurity. Further, in the case where the semiconductor is silicon, examples of an impurity which changes characteristics of the semiconductor include oxygen, Group 1 elements except hydrogen, Group 2 elements, Group 13 elements, and Group 15 elements.

In this specification, excess oxygen refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replace oxygen that is a constituent of a film or a layer and moves like a billiard ball. An insulating film containing excess oxygen means an insulating film from which oxygen is released by heat treatment, for example.

In this specification, an oxide semiconductor contains, for example, indium. An oxide semiconductor containing indium has high carrier mobility (electron mobility). An oxide semiconductor preferably contains an element M. Examples of the element M include aluminum, gallium, yttrium, and tin. The element M has high bond energy to oxygen, for example. The element M increases the energy gap of the oxide semiconductor, for example. Further, the oxide semiconductor preferably contains zinc. When containing zinc, the oxide semiconductor is likely to be crystalline. The energy at the top of the valence band (Ev) of the oxide semiconductor can be controlled by, for example, the atomic ratio of zinc, in some cases.

The oxide semiconductor does not necessarily contain indium. The oxide semiconductor may be, for example, Zn—Sn oxide or Ga—Sn oxide.

The oxide semiconductor may be In-M-Zn oxide having any of the following atomic ratios of In to M: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %. Further, the oxide semiconductor may be In-M-Zn oxide having any of the following atomic ratios of In to M: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

Influence of impurities in the oxide semiconductor is described below. In order to obtain stable electrical characteristics of a transistor, it is effective to reduce the concentration of impurities in the oxide semiconductor so that the oxide semiconductor is highly purified to be intrinsic. In the oxide semiconductor, a light element, a semimetal element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium are impurities in the oxide semiconductor in some cases. Thus, it is preferable that the concentration of impurities in a film close to the oxide semiconductor be lowered too.

For example, in some cases, silicon in an oxide semiconductor forms impurity states. Further, in some cases, silicon at the surface of an oxide semiconductor forms impurity states. The concentration of silicon in an oxide semiconductor or at the surface of an oxide semiconductor measured by secondary ion mass spectrometry (SIMS) is preferably lower than $1\times10^{19}$ atoms/cm$^3$, more preferably lower than $5\times10^{18}$ atoms/cm$^3$, still more preferably lower than $2\times10^{18}$ atoms/cm$^3$.

Further, in some cases, hydrogen in an oxide semiconductor forms impurity states, whereby carrier density is increased. Thus, the concentration of hydrogen in the oxide semiconductor, which is measured by SIMS, can be set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Further, in some cases, nitrogen in an oxide semiconductor forms impurity states, whereby carrier density is increased. Thus, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The crystallinity of the oxide semiconductor in this specification is described below.

An oxide semiconductor may include a non-single-crystal, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are shown in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a diameter larger than the diameter of a crystal part (for example, a beam diameter of 20 nmφ or more, or 50 nmφ or more). For example, spots are shown in some cases in a nanobeam electron diffraction pattern of the nc-OS obtained by using an electron beam having a diameter smaller than the diameter of a crystal part (for example, a beam diameter of 10 nmφ or less, or 5 nmφ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

<Transistor Having High Field-effect Mobility and High Reliability>

A transistor having high field-effect mobility and high reliability is described below.

First, one factor lowering field-effect mobility of a transistor is described.

In the case where there is a factor inhibiting carrier transfer in a channel formation region of a transistor, field-effect mobility of a transistor is lowered. An example of the factor inhibiting carrier transfer is a state in a bulk or at an interface. A state (interface state) is more likely to occur at an interface than in a bulk; thus, the interface affects carrier transfer more than the bulk does. Thus, by lowering, in particular, an interface state in the channel formation region of the transistor, a transistor having high field-effect mobility can be obtained in some cases.

Next, one factor lowering reliability of a transistor is described.

Charge trapping in or near the channel formation region of the transistor may cause variation in the electrical characteristics of the transistor. A gate insulating film or the like is included near the channel formation region of the transistor.

For example, in the case where electrons are captured by trap states and relaxation time of the electrons is long, the trap states may behave like negative fixed charges. When negative fixed charges exist in or near the channel formation region of the transistor, the threshold voltage of the transistor shifts in the positive direction. Similarly, in the case where holes are captured by trap states and relaxation time of the holes is long, for example, the trap states may behave like positive fixed charges. When positive fixed charges exist in or near the channel formation region of the transistor, the threshold voltage of the transistor shifts in the negative direction.

Thus, by lowering trap states capturing charges in or near the channel formation region of the transistor, a highly reliable transistor can be obtained.

A multi-layer film that can be used for the transistor is described. The transistor formed using the multi-layer film has high field-effect mobility. Further, the transistor has high reliability.

A cross-sectional view in FIG. 1A illustrates part of the transistor. The transistor includes a multi-layer film that includes oxide semiconductor layers S1 and S2, an insulating film and a gate insulating film between which the multi-layer film is positioned, and a gate electrode that overlaps with the multi-layer film with the gate insulating film interposed therebetween.

The oxide semiconductor layer S1 is formed using one or more or two or more of the elements other than oxygen that are included in the oxide semiconductor layer S2. Accordingly, the interface state density between the oxide semiconductor layers S1 and S2 is lowered.

The oxide semiconductor layers S1 and S2 preferably have the same or substantially the same atomic ratios of elements other than oxygen. Note that the oxide semiconductor layers S1 and S2 may have different atomic ratios of elements other than oxygen.

The multi-layer film has a mixed region between the oxide semiconductor layers S1 and S2 in some cases.

A method for forming a multi-layer film with which the field-effect mobility of the transistor is increased is described below.

In order to increase the field-effect mobility of the transistor, for example, the oxide semiconductor layers S1 and S2 are selected such that the oxide semiconductor layer S2 becomes a main path of drain current of the transistor. In other words, when drain current flows in the transistor, the oxide semiconductor layers S1 and S2 are selected such that the oxide semiconductor layer S2 has a high current density.

When the oxide semiconductor layer S2 has a high current density and the oxide semiconductor layer S1 has a low current density, an effect of the interface state between the insulating film and the oxide semiconductor layer S1 tends to be weakened. Since the oxide semiconductor layers S1 and S2 are both oxide semiconductor layers, the interface state density at their interface is low. That is, the effect of the interface state can be small, and thus the field-effect mobility of the transistor including such a multi-layer film is increased.

Next, an example of a combination of the oxide semiconductor layers S1 and S2 that increases the current density of the oxide semiconductor layer S2 is described below.

Figure 1A:
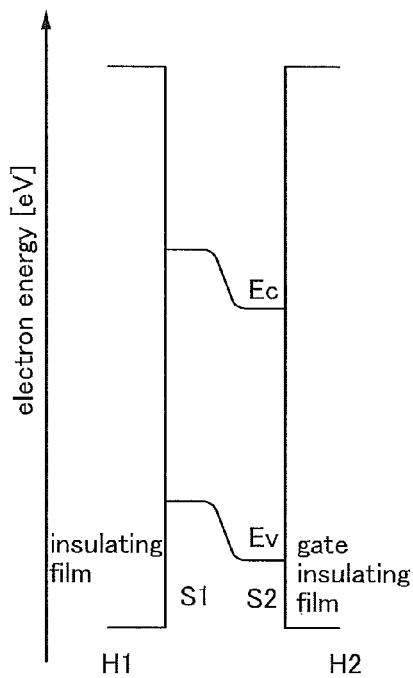
Figure 1A:
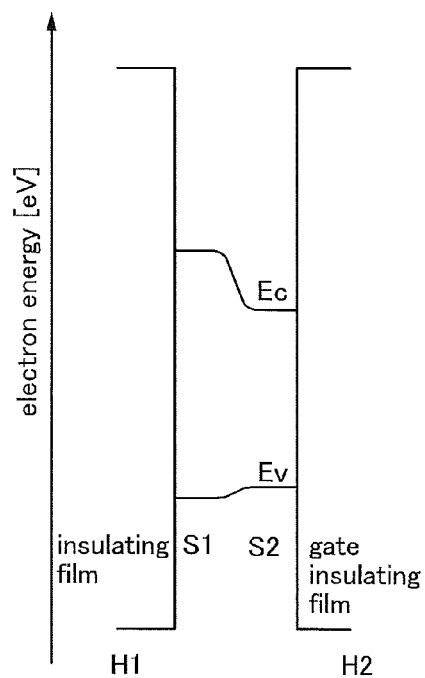
Figure 2A:
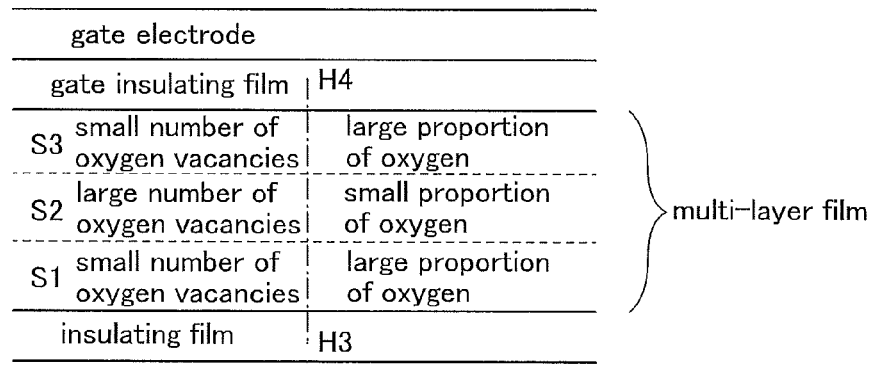
FIG. 2A is a cross-sectional view of part of a transistor of one embodiment of the present invention.
Figure 2A:
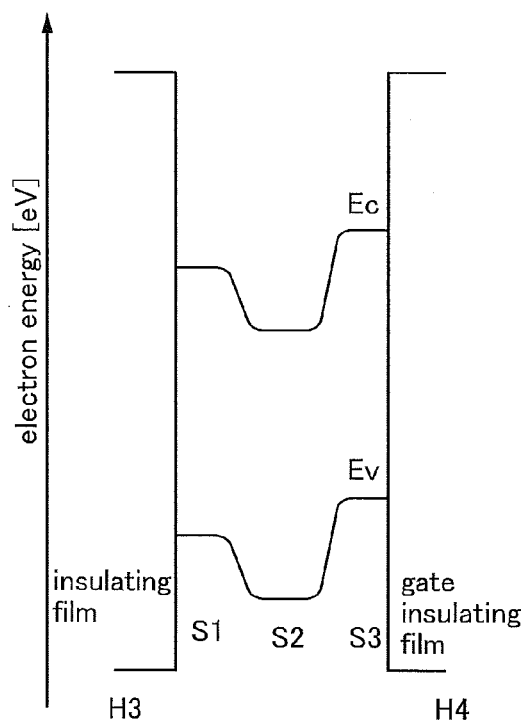
Figure 2A:
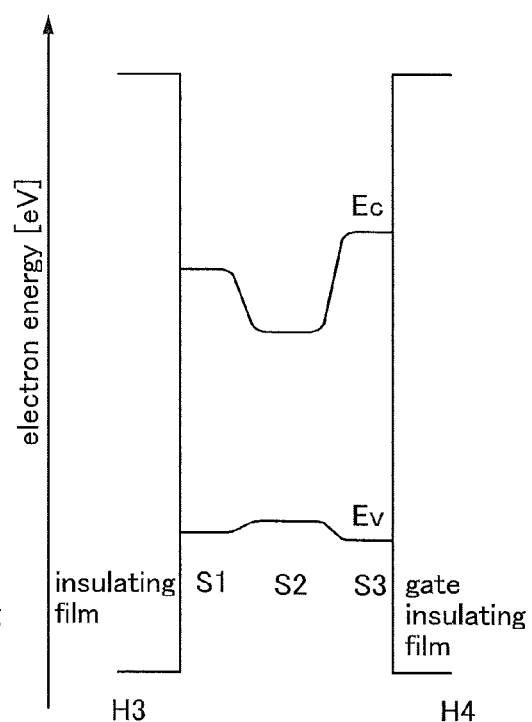

In order to increase the current density of the oxide semiconductor layer S2, for example, energy (Ec) at the bottom of the conduction band of the oxide semiconductor layer S2 is made lower than that of the oxide semiconductor layer S1 (see FIGS. 1B1 and 1B2). Specifically, for the oxide semiconductor layer S2, an oxide semiconductor having higher electron affinity than the oxide semiconductor layer S1 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

The energy gap of the oxide semiconductor layer S2 may be the same or substantially the same as that of the oxide semiconductor layer S1. To make such a band structure in FIG. 1B1, the donor density of the oxide semiconductor layer S2 is made higher than that of the oxide semiconductor layer S1. Alternatively, for example, the energy gap of the oxide semiconductor layer S2 may be smaller than that of the oxide semiconductor layer S1 (see FIG. 1B2). The energy gap can be obtained by, for example, an optical method. The energy gap obtained by an optical method is referred to as an "optical energy gap". Specifically, for the oxide semiconductor layer S2, an oxide semiconductor having smaller energy gap than the oxide semiconductor layer S1 by greater than or equal to 0.1 eV and smaller than or equal to 1.2 eV or by greater than or equal to 0.2 eV and smaller than or equal to 0.8 eV is used.

The energy (Ec) at the bottom of the conduction band of the oxide semiconductor layer S2 is made lower than that of the oxide semiconductor layer S1, so that electrons serving as carriers are concentrated in the oxide semiconductor layer S2 where the electrons are energetically stable, and thus the current density of the oxide semiconductor layer S2 can be increased.

Next, in order to make such band structures in FIGS. 1B1 and 1B2, the oxide semiconductor layers S1 and S2 can be formed as follows.

The number of oxygen vacancies in the oxide semiconductor layer S1 may be smaller than that in the oxide semiconductor layer S2. Alternatively, the proportion of oxygen in the oxide semiconductor layer S1 may be larger than that in the oxide semiconductor layer S2.

In other words, the number of oxygen vacancies in the oxide semiconductor layer S2 may be larger than that in the oxide semiconductor layer S1. Alternatively, the proportion of oxygen in the oxide semiconductor layer S2 may be smaller than that in the oxide semiconductor layer S1.

Note that the proportion of oxygen in a broader sense means the atomic ratio of oxygen in an oxide semiconductor. The proportion of oxygen in a narrow sense means the atomic ratio of oxygen in an oxide semiconductor in the case where the atomic ratio of oxygen is 1 when each element other than oxygen contained in the oxide semiconductor becomes oxide having the most stable crystal structure.

For example, in the case where the oxide semiconductor includes elements $M^1$, $M^2$, $M^3$, and O and the atomic ratio of $M^1$, $M^2$, $M^3$, and O is $M^1:M^2:M^3:O=a:b:c:d$, the proportion of oxygen in a narrow sense is expressed as follows.

When oxide having the most stable crystal structure of $M^1$ is $M^1O_X$, oxide having the most stable crystal structure of $M^2$ is $M^2O_Y$, and oxide having the most stable crystal structure of $M^3$ is $M^3O_Z$, the atomic ratio of oxygen is (aX+bY+cZ), which is based on an assumption that each element other than oxygen contained in the oxide semiconductor becomes oxide having the most stable crystal structure. Since the proportion of oxygen in a narrow sense is the atomic ratio of oxygen in an oxide semiconductor in the case where (aX+bY+cZ) is 1, the proportion of oxygen can be expressed as [d/(aX+bY+cZ)].

The number of oxygen vacancies can be evaluated by electron spin resonance (ESR); however, it would be difficult to measure the number of oxygen vacancies of each oxide semiconductor layer in the multi-layer film. In contrast, it is possible to measure the atomic ratio of oxygen in the multi-layer film. For example, the atomic ratio of each oxide semiconductor layer can be observed by scanning transmission electron microscope (STEM) and can be measured by energy dispersive X-ray spectroscopy (EDX). Alternatively, for example, the atomic ratio of each oxide semiconductor layer can be measured by SIMS. Further alternatively, for example, the atomic ratio of each oxide semiconductor layer can be measured by X-ray photoelectron spectroscopy (XPS).

If the proportion of oxygen is reduced as the number of oxygen vacancies increases, the number of oxygen vacancies can be estimated by measuring the atomic ratio of each oxide semiconductor layer in some cases.

When the oxide semiconductor layers have the same or substantially the same atomic ratios of the elements other than oxygen, the larger the number of oxygen vacancies is, the smaller the densities of the oxide semiconductor layers are. For example, the density of the oxide semiconductor layer 51 is greater than or equal to 1.005 times and smaller than or equal to 1.06 times, or greater than or equal to 1.01 times and smaller than or equal to 1.04 times that of the oxide semiconductor layer S2.

Even in the case where the oxide semiconductor layers do not have the same or substantially the same atomic ratios of the elements other than oxygen, the densities of the oxide semiconductor layers can be compared based on the atomic ratios of the elements other than oxygen.

It is preferable that the oxide semiconductor layer S1 be formed thick and the oxide semiconductor layer S2 be formed thin. Specifically, the thickness of the oxide semiconductor layer S1 is greater than or equal to 20 nm, preferably greater than or equal to 30 nm, more preferably greater than or equal to 40 nm, still more preferably greater than or equal to 60 nm. With the oxide semiconductor layer S1 having the above thickness, the interface between the insulating film and the oxide semiconductor layer S1 can be separated from the oxide semiconductor layer S2 having a high current density to have a distance greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the oxide semiconductor layer S1 is smaller than or equal to 200 nm, preferably smaller than or equal to 120 nm, more preferably smaller than or equal to 80 nm. The thickness of the oxide semiconductor layer S2 is greater than or equal to 3 nm and less than or equal to 100 nm, preferably greater than or equal to 3 nm and less than or equal to 80 nm, more preferably greater than or equal to 3 nm and less than or equal to 50 nm.

As described above, the transistor including the multi-layer film has high field-effect mobility because the interface state that is a factor inhibiting carrier transfer is not likely to affect the transistor.

The interface state inhibiting carrier transfer may become a trap state capturing carriers. Thus, the transistor including the multi-layer film has high reliability because the density of interface states causing trap states is low.

A transistor including a multi-layer film different from the multi-layer film in FIGS. 1A to 1B2 is described with reference to FIGS. 2A to 2B2. The transistor has higher field-effect mobility than the transistor including the multi-layer film in FIGS. 1A to 1B2. Further, the transistor has higher reliability than the transistor including the multi-layer film in FIGS. 1A to 1B2.

A cross-sectional view in FIG. 2A illustrates part of the transistor. The transistor includes a multi-layer film that includes oxide semiconductor layers S1, S2, and S3, an insulating film and a gate insulating film between which the multi-layer film is positioned, and a gate electrode that overlaps with the multi-layer film with the gate insulating film interposed therebetween.

The multi-layer film in FIG. 2A is the same as that in FIG. 1A except that the oxide semiconductor layer S3 is included. Thus, the multi-layer film in FIG. 1A can be referred to for that in FIG. 2A.

The oxide semiconductor layer S3 is formed using one or more or two or more of the elements other than oxygen that are included in the oxide semiconductor layer S2. Accordingly, the interface state density between the oxide semiconductor layers S2 and S3 is lowered.

The oxide semiconductor layers S2 and S3 preferably have the same or substantially the same atomic ratios of elements other than oxygen. Note that the oxide semiconductor layers S2 and S3 may have different atomic ratios of elements other than oxygen.

The multi-layer film has a mixed region between the oxide semiconductor layers S2 and S3 in some cases.

A method for forming a multi-layer film with which the field-effect mobility of the transistor is increased is described below.

In order to increase the field-effect mobility of the transistor, for example, the oxide semiconductor layers S1, S2, and S3 are selected such that the oxide semiconductor layer S2 becomes a main path of drain current of the transistor. In other words, when drain current flows in the transistor, the oxide semiconductor layers S1, S2, and S3 are selected such that the oxide semiconductor layer S2 has a high current density.

When the oxide semiconductor layer S2 has a high current density and the oxide semiconductor layers S1 and S2 each have a low current density, an effect of the interface state between the insulating film and the oxide semiconductor layer S1 and an effect of the interface state density between the oxide semiconductor layer S3 and the gate insulating film tend to be weakened. Since the oxide semiconductor layers S1 and S2 are both an oxide semiconductor layer, the interface state density at their interface is low. Further, since the oxide semiconductor layers S2 and S3 are both an oxide semiconductor layer, the interface state density at their interface is low. That is, the effect of the interface state can be smaller than that in the case of the multi-layer film in FIGS. 1A to 1B2, and thus the field-effect mobility of the transistor including such a multi-layer film is increased.

Next, an example of a combination of the oxide semiconductor layers S1, S2, and S3 that increases the current density of the oxide semiconductor layer S2 is described below.

In order to increase the current density of the oxide semiconductor layer S2, for example, energy (Ec) at the bottom of the conduction band of the oxide semiconductor layer S2 is made lower than those of the oxide semiconductor layers S1 and S3 (see FIGS. 2B1 and 2B2). Specifically, for the oxide semiconductor layer S2, an oxide semiconductor having higher electron affinity than the oxide semiconductor layers S1 and S3 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

The energy gap of the oxide semiconductor layer S2 may be the same or substantially the same as that of the oxide semiconductor layer S1 and/or S3. To make such a band structure in FIG. 2B1, the donor density of the oxide semiconductor layer S2 is made higher than that of each of the oxide semiconductor layers S1 and S3. Alternatively, for example, the energy gap of the oxide semiconductor layer S2 may be smaller than that of each of the oxide semiconductor layers S1 and S3 (see FIG. 2B2). Specifically, for the oxide semiconductor layer S2, an oxide semiconductor having smaller energy gap than the oxide semiconductor layers S1 and S3 by greater than or equal to 0.1 eV and smaller than or equal to 1.2 eV or by greater than or equal to 0.2 eV and smaller than or equal to 0.8 eV is used.

The energy (Ec) at the bottom of the conduction band of the oxide semiconductor layer S2 is made lower than that of each of the oxide semiconductor layers S1 and S3, so that electrons serving as carriers are concentrated in the oxide semiconductor layer S2 where the electrons are energetically stable, and thus the current density of the oxide semiconductor layer S2 can be increased.

Next, in order to make such band structures in FIGS. 2B1 and 2B2, the oxide semiconductor layers S1, S2, and S3 can be formed as follows.

The number of oxygen vacancies in each of the oxide semiconductor layers S1 and S3 may be smaller than that in the oxide semiconductor layer S2. Alternatively, the proportion of oxygen in each of the oxide semiconductor layers S1 and S3 may be larger than that in the oxide semiconductor layer S2.

In other words, the number of oxygen vacancies in the oxide semiconductor layer S2 may be larger than that in each of the oxide semiconductor layers S1 and S3. Alternatively, the proportion of oxygen in the oxide semiconductor layer S2 may be lower than that in each of the oxide semiconductor layers 51 and S3.

For example, the density of the oxide semiconductor layer S3 is greater than or equal to 1.005 times and smaller than or equal to 1.05 times, or greater than or equal to 1.01 times and smaller than or equal to 1.03 times that of the oxide semiconductor layer S2.

The oxide semiconductor layer S3 is positioned closer to the gate electrode than the oxide semiconductor layer S1 is. Thus, the oxide semiconductor layer S3 tends to have a higher current density than that of the oxide semiconductor layer S1.

Therefore, the oxide semiconductor layer S3 preferably has a higher energy (Ec) at the bottom of the conduction band than that of the oxide semiconductor layer S1. Further, the oxide semiconductor layer S3 preferably has a higher energy gap than that of the oxide semiconductor layer S1. Note that the oxide semiconductor layer S3 may have the same or substantially the same energy at the bottom of the conduction band as that of the oxide semiconductor layer S1. Further, the oxide semiconductor layer S3 may have the same or substantially the same energy gap as that of the oxide semiconductor layer S1.

To increase the on-state current of the transistor, the thickness of the oxide semiconductor layer S3 is preferably as small as possible. For example, the thickness of the oxide semiconductor layer S3 is less than 10 nm, preferably less than or equal to 5 nm, more preferably less than or equal to 3 nm. In contrast, the oxide semiconductor layer S3 blocks entry of elements (e.g., silicon) other than oxygen contained in the gate insulating film to the oxide semiconductor layer S2 having a high current density. Thus, the oxide semiconductor layer S3 preferably has a certain thickness. For example, the thickness of the oxide semiconductor layer S3 is greater than or equal to 0.3 nm, preferably greater than or equal to 1 nm, more preferably greater than or equal to 2 nm.

The oxide semiconductor layer S1 is preferably formed thick. The oxide semiconductor layers S2 and S3 are preferably formed thin. Specifically, the thickness of the oxide semiconductor layer S1 is greater than or equal to 20 nm, preferably greater than or equal to 30 nm, more preferably greater than or equal to 40 nm, still more preferably greater than or equal to 60 nm. With the oxide semiconductor layer S1 having the above thickness, the interface between the insulating film and the oxide semiconductor layer S1 can be separated from the oxide semiconductor layer S2 having a high current density to have a distance greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the oxide semiconductor layer S1 is smaller than or equal to 200 nm, preferably smaller than or equal to 120 nm, more preferably smaller than or equal to 80 nm. The thickness of the oxide semiconductor layer S2 is greater than or equal to 3 nm and less than or equal to 100 nm, preferably greater than or equal to 3 nm and less than or equal to 80 nm, more preferably greater than or equal to 3 nm and less than or equal to 50 nm.

For example, the thickness of the oxide semiconductor layer S1 may be greater than that of the oxide semiconductor layer S2, and the thickness of the oxide semiconductor layer S2 may be greater than that of the oxide semiconductor layer S3.

As described above, the transistor including the multi-layer film in FIGS. 2A to 2B2 has higher field-effect mobility than that of the transistor including the multi-layer film in FIGS. 1A to 1B2 because the effect of the interface state that is a factor inhibiting carrier transfer in the transistor including the multi-layer film in FIGS. 2A to 2B2 is smaller than that in the transistor including the multi-layer film in FIGS. 1A to 1B2.

Further, the transistor including the multi-layer film in FIGS. 2A to 2B2 has higher reliability than that of the transistor including the multi-layer film in FIGS. 1A to 1B2 because the density of interface states causing trap states in the transistor including the multi-layer film in FIGS. 2A to 2B2 is smaller than that in the transistor including the multi-layer film in FIGS. 1A to 1B2.

<Structure and Manufacturing Method of Transistor Including Multi-Layer Film>

A structure of a transistor including a multi-layer film and a method for manufacturing the transistor are described below.

<Transistor with Structure (1)>

First, an example of a top-gate top-contact transistor is described.

Figure 3A:
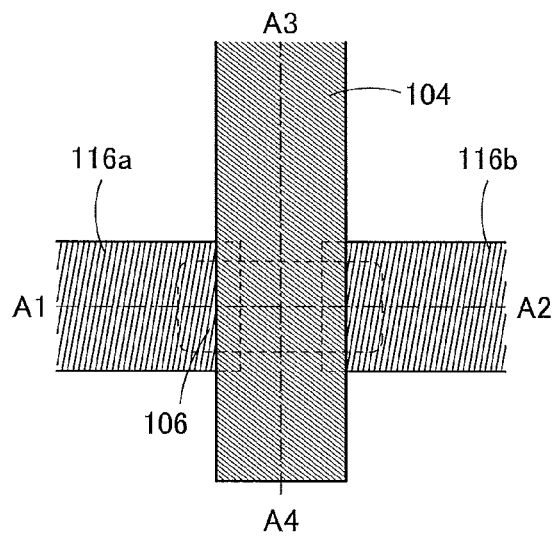
FIG. 3A is a top view illustrating an example of a transistor of one embodiment of the present invention.
Figure 3C:
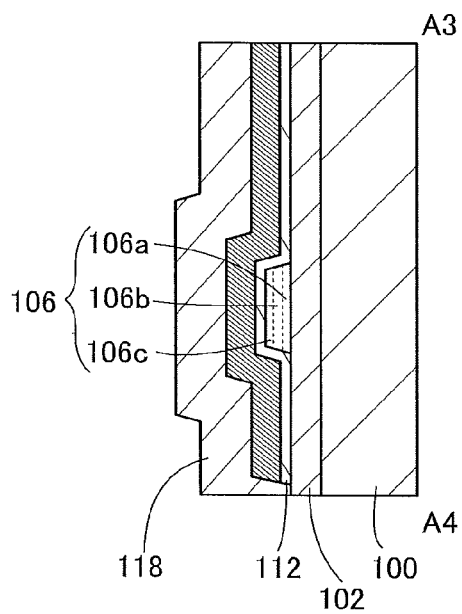
FIGS. 3B and 3C are cross-sectional views thereof.
Figure 3B:
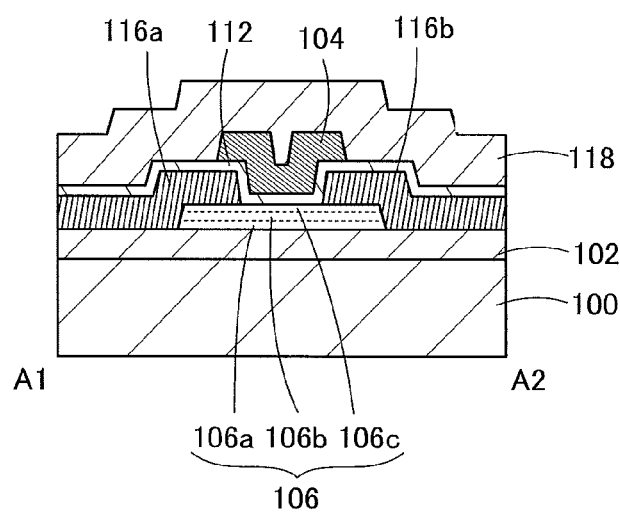

FIGS. 3A to 3C are a top view and cross-sectional views of transistors. FIG. 3A is the top view of the transistor. FIG. 3B is a cross-sectional view taken along dashed-dotted line A1-A2 in FIG. 3A. FIG. 3C is a cross-sectional view taken along dashed-dotted line A3-A4 in FIG. 3A.

The transistor in FIG. 3B includes a base insulating film 102 over a substrate 100; an oxide semiconductor layer 106a over the base insulating film 102; an oxide semiconductor layer 106b over the oxide semiconductor layer 106a; an oxide semiconductor layer 106c over the oxide semiconductor layer 106b; a source electrode 116a and a drain electrode 116b which are in contact with the oxide semiconductor layer 106c; a gate insulating film 112 over the oxide semiconductor layer 106c, the source electrode 116a, and the drain electrode 116b; and a gate electrode 104 over the gate insulating film 112. A protective insulating film 118 is preferably provided over the gate insulating film 112 and the gate electrode 104. Note that the transistor does not necessarily include the base insulating film 102.

The oxide semiconductor layer 106a of the transistor in FIGS. 3A to 3C corresponds to the oxide semiconductor layer S1 in FIGS. 2A to 2B2, for example. The oxide semiconductor layer 106b of the transistor in FIGS. 3A to 3C corresponds to the oxide semiconductor layer S2 in FIGS. 2A to 2B2, for example. The oxide semiconductor layer 106c of the transistor in FIGS. 3A to 3C corresponds to the oxide semiconductor layer S3 in FIGS. 2A to 2B2, for example. Here, the oxide semiconductor layer 106a, the oxide semiconductor layer 106b, and the oxide semiconductor layer 106c are collectively referred to as the multi-layer film 106.

Note that although a multi-layer film corresponding to the multi-layer film in FIGS. 2A to 2B2 is used here, the present invention is not limited to this. For example, a multi-layer film corresponding to the multi-layer film in FIGS. 1A to 1B2 may be used. Further, for example, a multi-layer film including four or more layers may be used. The description of the multi-layer films in FIGS. 1A to 1B2 and FIGS. 2A to 2B2 is referred to for the details of the multi-layer film 106.

Depending on the kind of the conductive film used for the source electrode 116a and the drain electrode 116b, oxygen is removed from parts of the oxide semiconductor layers 106b and 106c or a mixed layer is formed so that n-type regions (low-resistance regions) are formed in the oxide semiconductor layers 106b and 106c in some cases.

In FIG. 3A, the distance between the source electrode 116a and the drain electrode 116b in a region overlapping with the gate electrode 104 is called channel length. Note that in the case where the transistor includes the n-type regions, the distance between the source region and the drain region in the region overlapping with the gate electrode 104 may be referred to as a channel length.

Note that a channel formation region refers to a region which overlaps with the gate electrode 104 and is located between the source electrode 116a and the drain electrode 116b in the oxide semiconductor layer 106c (see FIG. 3B). Further, a channel refers to a region through which current mainly flows in the channel formation region.

Note that as illustrated in FIG. 3A, the gate electrode 104 is provided such that the edge of the oxide semiconductor layer 106b is located on the inner side of the edge of the gate electrode 104 in the top view. With such a structure, when light irradiation is performed from the gate electrode 104 side, generation of carriers in the oxide semiconductor layer 106b due to light can be prevented. In other words, the gate electrode 104 functions as a light-blocking film. The oxide semiconductor layer 106b may be provided to extend to the outside of the gate electrode 104.

The base insulating film 102 in FIGS. 3B and 3C may be formed of a single layer or a stacked layer of an insulating film containing one or more of aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, and the like.

The base insulating film 102 is, for example, a multilayer film including a silicon nitride layer as a first layer and a silicon oxide layer as a second layer. In this case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride layer, a silicon nitride layer from which hydrogen and ammonia are less likely to be released is used. The amount of released hydrogen or released ammonia may be measured by thermal desorption spectroscopy (TDS). Further, as the silicon nitride layer, a silicon nitride layer which does not transmit or hardly transmits hydrogen, water, and oxygen is used.

The base insulating film 102 may be, for example, a multilayer film including a silicon nitride layer as a first layer, a first silicon oxide layer as a second layer, and a second silicon oxide layer as a third layer. In this case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits hydrogen, water, and oxygen is used.

The silicon oxide layer having excess oxygen means a silicon oxide layer from which oxygen can be released by heat treatment or the like. An insulating film having excess oxygen means an insulating film from which oxygen is released by heat treatment.

The insulating film containing excess oxygen is capable of reducing the number of oxygen vacancies in the oxide semiconductor layer. For example, the number of oxygen vacancies in the oxide semiconductor layer 106a can be reduced by using oxygen released from the base insulating film 102.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms). The TDS analysis may be performed at a temperature ranging from 100° C. to 700° C. or ranging from 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from the measurement sample can be calculated according to Formula (1) using the TDS results of a silicon wafer containing hydrogen at a predetermined density, which is the standard sample, and the TDS results of the measurement sample. Here, all gases having a mass number of 32 which are obtained in the TDS analysis are assumed to originate from an oxygen molecule. A CH$_3$OH, which is a molecule having the mass number of 32, is not taken into consideration here on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

[Formula 1]

$$N_{O2} = \frac{N_{H2}}{S_{H2}} \times S_{O2} \times \alpha \qquad (1)$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value α is a coefficient affecting the ion intensity in the TDS analysis. For the details of Formula (1), Japanese Published Patent Application No. H6-275697 is referred to. The amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Further or alternatively, the film from which oxygen is released by heat treatment may contain a peroxide radical. Specifically, the spin density attributed to the peroxide radical is greater than or equal to $5\times10^{17}$ spins/cm$^3$. Note that the film containing a peroxide radical may have an asymmetric signal with a g factor of approximately 2.01 in ESR.

The insulating film containing excess oxygen may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The source electrode 116a and the drain electrode 116b may be formed of a single layer or a stacked layer of a conductive film containing one or more kinds of aluminum, titanium, chromium, cobalt, nickel, copper, yttrium, zirconium, molybdenum, ruthenium, silver, tantalum, and tungsten, for example. The source electrode 116a and the drain electrode 116b are each preferably a multilayer film including a layer containing copper. The source electrode 116a and the drain electrode 116b are each a multilayer film including a layer containing copper, whereby wiring resistance can be reduced in the case where a wiring is formed in the same layer as the source electrode 116a and the drain electrode 116b. Note that the compositions of the source electrode 116a and the drain electrode 116b are either the same as or different from each other.

When a multi-layer film including a layer containing copper is used for the source electrode 116a and the drain electrode 116b, the carrier density of the oxide semiconductor layer 106b is increased by entry of copper into the oxide semiconductor layer 106b in some cases. Alternatively, copper forms DOS in the oxide semiconductor layer 106b and the DOS serves as a charge trap in some cases. At this time, in the case where the oxide semiconductor layer 106c has a function of blocking copper, an increase in off-state current and a change in threshold voltage due to entry of copper into the oxide semiconductor layer 106b can be suppressed.

The gate insulating film 112 in FIGS. 3B and 3C may be formed of a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The gate insulating film 112 may be, for example, a multilayer film including a silicon nitride layer as a first layer and a silicon oxide layer as a second layer. In this case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/$cm^3$, preferably lower than or equal to $5\times10^{16}$ spins/$cm^3$ is used. As the silicon oxide layer, a silicon oxide layer having excess oxygen is preferably used. As the silicon nitride layer, a silicon nitride layer from which a hydrogen gas and an ammonia gas are less likely to be released is used. The amount of released hydrogen gas or released ammonia gas may be measured by TDS.

In the case where the gate insulating film 112 contains excess oxygen, the number of oxygen vacancies in the oxide semiconductor layer 106c can be reduced by using oxygen released from the gate insulating film 112.

The gate electrode 104 may be formed of a single layer or a stacked layer of a conductive film containing one or more kinds of aluminum, titanium, chromium, cobalt, nickel, copper, yttrium, zirconium, molybdenum, ruthenium, silver, tantalum, and tungsten, for example.

The protective insulating film 118 may be formed of a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate whose shrinkage due to heat treatment is as less as possible is preferably used. For example, as the substrate 100, it is possible to use a large glass substrate in which the amount of shrinkage by heat treatment for one hour at 400° C., preferably 450° C., more preferably 500° C. is less than or equal to 10 ppm, preferably less than or equal to 5 ppm, more preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In this case, a separation layer is preferably provided between the non-flexible substrate and the transistor.

<Manufacturing Method of Transistor with Structure 1>

An example of a method for manufacturing Transistor with Structure 1 is described below.

FIGS. 4A to 4E are cross-sectional views illustrating a method for manufacturing the transistor in FIG. 3B.

First, the substrate 100 is prepared.

Next, the base insulating film 102 is formed. The base insulating film 102 can be deposited by a sputtering method, a chemical vapor deposition (CVD) method, a molecular beam epitaxy (MBE) method, an atomic layer deposition (ALD) method, or a pulsed laser deposition (PLD) method. In the case where a silicon wafer is used as the substrate 100, the base insulating film 102 may be formed by a thermal oxidation method.

Next, to planarize the surface of the base insulating film 102, chemical mechanical polishing (CMP) treatment may be performed. By performing the CMP treatment, the average surface roughness (Ra) of the base insulating film 102 is made less than or equal to 1 nm, preferably less than or equal to 0.3 mu, more preferably less than or equal to 0.1 nm. With Ra that is less than or equal to the above value, the crystallinity of the oxide semiconductor layer 106b is improved in some cases. Note that Ra is obtained by expanding arithmetic mean surface roughness that is defined by JIS B 0601: 2001 (ISO4287:1997), into three dimensions for application to a curved surface, and Ra can be expressed as the average value of the absolute values of deviations from a reference surface to a specific surface and is defined by Formula 2.

[Formula 2]

$$Ra = \frac{1}{S_0} \int_{y_1}^{y_2} \int_{x_1}^{x_2} |f(x, y) - Z_0| dx dy \qquad (2)$$

Here, the specific surface is a surface which is a target of roughness measurement, and is a quadrilateral region which is specified by four points represented by the coordinates $(x_1, y_1, f(x_1, y_2, f(x_1, y_2)), (x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

An insulating film containing excess oxygen may be formed by addition of oxygen ions to the base insulating film 102. Oxygen ions may be added by, for example, an ion implantation method at an accelerating voltage of higher than or equal to 2 kV and lower than or equal to 100 kV and a dosage of greater than or equal to $5 \times 10^{14}$ ions/cm$^2$ and less than or equal to $5 \times 10^{16}$ ions/cm$^2$.

Next, an oxide semiconductor layer to be the oxide semiconductor layer 106a, an oxide semiconductor layer to be the oxide semiconductor layer 106b, and an oxide semiconductor layer to be the oxide semiconductor layer 106c are formed in this order. The oxide semiconductor layers 106a to 106c may be formed by a sputtering method, a CVD method, an MBE method, an ALD method, or a PLD method.

When In-M-Zn oxide is formed by a sputtering method for the oxide semiconductor layers to be the oxide semiconductor layers 106a to 106c, the atomic ratio of the target may be as follows: In:M:Z=3:1:1, 3:1:2, 3:1:4, 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, 1:9:10, or the like. Examples of the element M include aluminum, gallium, yttrium, and tin.

When the oxide semiconductor layer to be the oxide semiconductor layer 106a is formed by a sputtering method, it is formed under an atmosphere containing oxygen. The proportion of oxygen in the atmosphere is, for example, larger than or equal to 10 volume %, preferably larger than or equal to 20 volume %, more preferably larger than or equal to 50 volume %, still more preferably larger than or equal to 80 volume %. In particular, the proportion of oxygen in the atmosphere is preferably 100 volume %. When the proportion of oxygen in the atmosphere is 100 volume %, the concentration of impurities (e.g., a rare gas) which are contained in the oxide semiconductor layer 106a can be reduced. The concentration of helium, neon, argon, krypton, or xenon which is a rare gas contained in the oxide semiconductor layer 106a can be lower than $1 \times 10^{20}$ atoms/cm$^3$, preferably lower than $5 \times 10^{19}$ atoms/cm$^3$, more preferably lower than $1 \times 10^{19}$ atoms/cm$^3$.

When the oxide semiconductor layer to be the oxide semiconductor layer 106a is formed under such an atmosphere, the number of oxygen vacancies in the oxide semiconductor layer to be the oxide semiconductor layer 106a can be reduced. Further, the proportion of oxygen in the oxide semiconductor layer to be the oxide semiconductor layer 106a can be increased. Further, the density of the oxide semiconductor layer to be the oxide semiconductor layer 106a can be increased.

For example, the proportion of oxygen in a narrow sense in the oxide semiconductor layer to be the oxide semiconductor layer 106a can be larger than or equal to 1.05 and smaller than or equal to 1.3, or larger than or equal to 1.1 and smaller than or equal to 1.25. As described above, the proportion of oxygen in a narrow sense means the atomic ratio of oxygen in an oxide semiconductor in the case where the atomic ratio of oxygen is 1 when each element other than oxygen contained in the oxide semiconductor becomes oxide having the most stable crystal structure.

When the oxide semiconductor layer to be the oxide semiconductor layer 106b is formed by a sputtering method, it is formed under an atmosphere not containing oxygen. For example, the oxide semiconductor layer to be the oxide semiconductor layer 106b may be formed under an atmosphere containing helium, neon, argon, krypton, or xenon which is a rare gas. In particular, the proportion of oxygen in the atmosphere is, for example, smaller than 10 volume %, preferably smaller than 1 volume %, more preferably smaller than 0.1 volume %, still more preferably smaller than 0.01 volume %.

When the oxide semiconductor layer to be the oxide semiconductor layer 106b is formed under such an atmosphere, the number of oxygen vacancies in the oxide semiconductor layer to be the oxide semiconductor layer 106b can be increased. Further, the proportion of oxygen in the oxide semiconductor layer to be the oxide semiconductor layer 106b can be reduced. Further, the density of the oxide semiconductor layer to be the oxide semiconductor layer 106b can be decreased.

For example, the proportion of oxygen in a narrow sense of the oxide semiconductor layer to be the oxide semiconductor layer 106b can be larger than or equal to 0.95 and smaller than 1.05, or larger than or equal to 0.98 and smaller than or equal to 1.02.

When the oxide semiconductor layer to be the oxide semiconductor layer 106c is formed by a sputtering method, it is formed under an atmosphere containing oxygen. The proportion of oxygen in the atmosphere is, for example, larger than or equal to 10 volume %, preferably larger than or equal to 20 volume %, more preferably larger than or equal to 50 volume %, still more preferably larger than or equal to 80 volume %. In particular, the proportion of oxygen in the atmosphere is preferably 100 volume %. When the proportion of oxygen in the atmosphere is 100 volume %, the concentration of impurities (e.g., a rare gas) which are contained in the oxide semiconductor layer 106c can be reduced. The concentration of helium, neon, argon, krypton, or xenon which is a rare gas contained in the oxide semiconductor layer 106c can be lower than $1 \times 10^{20}$ atoms/cm$^3$, preferably lower than $5 \times 10^{19}$ atoms/cm$^3$, more preferably lower than $1 \times 10^{19}$ atoms/cm$^3$.

When the oxide semiconductor layer to be the oxide semiconductor layer 106c is formed under such an atmosphere, the number of oxygen vacancies in the oxide semiconductor layer to be the oxide semiconductor layer 106c can be reduced. Further, the proportion of oxygen in the oxide semiconductor layer to be the oxide semiconductor layer 106c can be increased. Further, the density of the oxide semiconductor layer to be the oxide semiconductor layer 106c can be increased.

For example, the proportion of oxygen in a narrow sense of the oxide semiconductor layer to be the oxide semiconductor layer 106c can be larger than or equal to 1.05 and smaller than or equal to 1.3, or larger than or equal to 1.1 and smaller than or equal to 1.25.

Next, the oxide semiconductor layer to be the oxide semiconductor layer 106a, the oxide semiconductor layer to be the oxide semiconductor layer 106b, and the oxide semiconductor layer to be the oxide semiconductor layer 106c are preferably formed using the same target. In this case, the oxide semiconductor layers to be the oxide semiconductor layers 106a to 106c can be formed by controlling only the atmosphere during deposition; thus, transfer of the substrate between deposition chambers is not needed. The multi-layer film can be formed successively; thus, entry of impurities into the interface or the like is unlikely to occur and defects due to impurities are unlikely to be caused. Further, semiconductor devices can be manufactured with improved productivity. The number of deposition apparatuses can be reduced, so that manufacturing costs of the semiconductor devices can be reduced.

Note that the oxide semiconductor layers to be the oxide semiconductor layers 106a to 106c are not necessarily formed using the same target.

In the case where the oxide semiconductor layer is formed by a sputtering method, a film having an atomic ratio deviated from the atomic ratio of the target is formed in some cases. For example, when zinc is formed under an atmosphere containing oxygen, the atomic ratio of zinc in the formed film is smaller than that in the target in some cases. Specifically, the atomic ratio of zinc in the formed film is higher than or equal to 40 atomic % and lower than or equal to 90 atomic % of that in the target in some cases. Further, for example, when indium is formed under an atmosphere containing oxygen, the atomic ratio of indium in the formed film is smaller than that in the target in some cases.

Therefore, for example, when the oxide semiconductor layers to be the oxide semiconductor layers 106a to 106c are formed by a sputtering method using the same target which is In-M-Zn oxide, the oxide semiconductor layer to be the oxide semiconductor layer 106a may have lower atomic ratios of zinc and indium and a higher atomic ratio of the element M than those of the oxide semiconductor layer to be the oxide semiconductor layer 106b. Further, the oxide semiconductor layer to be the oxide semiconductor layer 106c may have lower atomic ratios of zinc and indium and a higher atomic ratio of the element M than those of the oxide semiconductor layer to be the oxide semiconductor layer 106b.

As described above, an oxide semiconductor containing indium has higher electron mobility. Thus, the oxide semiconductor layer to be the oxide semiconductor layer 106b having a higher atomic ratio of indium may have higher electron mobility than that of each of the oxide semiconductor layers to be the oxide semiconductor layers 106a and 106c.

As the atomic ratio of the element M increases, the energy gap increases. Thus, each of the oxide semiconductor layers to be the oxide semiconductor layers 106a and 106c may have a larger energy gap than that of the oxide semiconductor layer to be the oxide semiconductor layer 106b.

After the oxide semiconductor layer to be the oxide semiconductor layer 106c is formed, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layers to be the oxide semiconductor layers 106a to 106c can be increased, and impurities such as hydrogen or water can be removed from the oxide semiconductor layers to be the oxide semiconductor layers 106b and 106c. By the first heat treatment, the oxide semiconductor layers to be the oxide semiconductor layers 106b and 106c can be highly purified to be intrinsic.

Figure 4A:
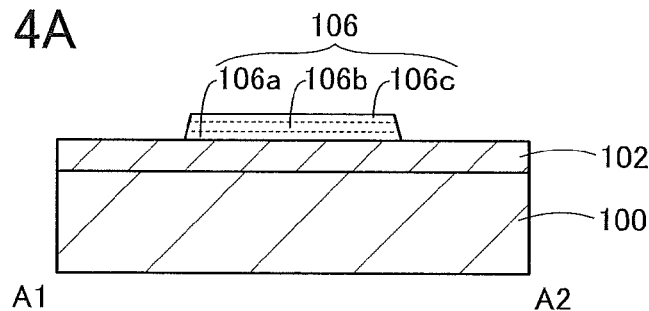
FIGS. 4A to 4E are cross-sectional views illustrating an example of a method for manufacturing a transistor of one embodiment of the present invention.

Next, the oxide semiconductor layers to be the oxide semiconductor layers 106a to 106c are partly etched to form the multi-layer film 106 including the oxide semiconductor layers 106a to 106c (see FIG. 4A).

Next, a conductive film to be the source electrode 116a and the drain electrode 116b is formed. The conductive film to be the source electrode 116a and the drain electrode 116b can be formed using a conductive film selected from the conductive films given as examples of the source electrode 116a and the drain electrode 116b. The conductive film to be the source electrode 116a and the drain electrode 116b may be formed by a sputtering method, a CVD method, an MBE method, an ALD method, or a PLD method. At this time, a region in the oxide semiconductor layer 106c becomes an n-type region in some cases. The n-type region is formed by damage at the time of forming the conductive film to be the source electrode 116a and the drain electrode 116b over the oxide semiconductor layer 106c or by oxygen vacancies in the oxide semiconductor layer 106c which are caused by the action of the conductive film to be the source electrode 116a and the drain electrode 116b. For example, due to entry of hydrogen into sites of the oxygen vacancies, an electron serving as a carrier is generated in some cases.

Figure 4B:
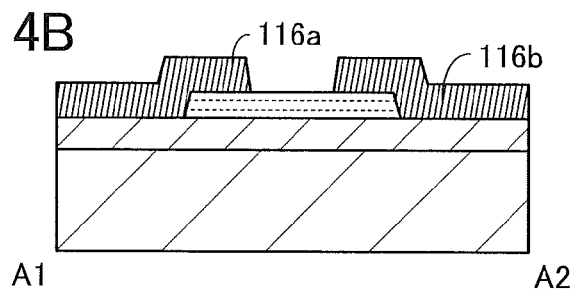

Next, the conductive film to be the source electrode 116a and the drain electrode 116b is partly etched to form the source electrode 116a and the drain electrode 116b (see FIG. 4B).

Then, second heat treatment is preferably performed. The second heat treatment may be performed under conditions selected from those of the first heat treatment. By the second heat treatment, the n-type region of the exposed part of the oxide semiconductor layer 106c can be an i-type region in some cases. Thus, n-type regions can be formed only in the parts of the oxide semiconductor layer 106c which are directly under the source electrode 116a and the drain electrode 116b. When the oxide semiconductor layer 106c includes the n-type regions, contact resistance between the oxide semiconductor layer 106c and each of the source electrode 116a and the drain electrode 116b can be lowered, so that on-state current of the transistor can be increased. The first heat treatment is not necessarily performed when the second heat treatment is performed.

Figure 4C:
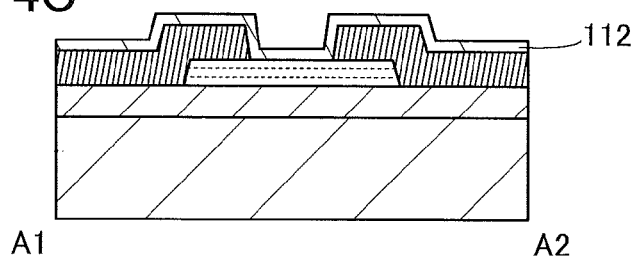

Next, the gate insulating film 112 is formed (see FIG. 4C). The gate insulating film 112 may be formed by a sputtering method, a CVD method, an MBE method, an ALD method, or a PLD method.

Next, a conductive film to be the gate electrode 104 is formed. The conductive film to be the gate electrode 104 can be formed using a conductive film selected from the conductive films given as examples of the gate electrode 104. The conductive film to be the gate electrode 104 may be formed by a sputtering method, a CVD method, an MBE method, an ALD method, or a PLD method.

Figure 4D:
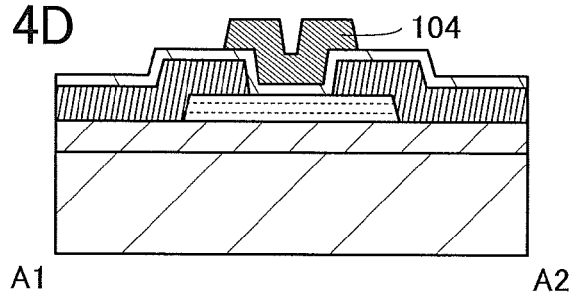

Next, the conductive film to be the gate electrode 104 is partly etched to form the gate electrode 104 (see FIG. 4D).

Figure 4E:
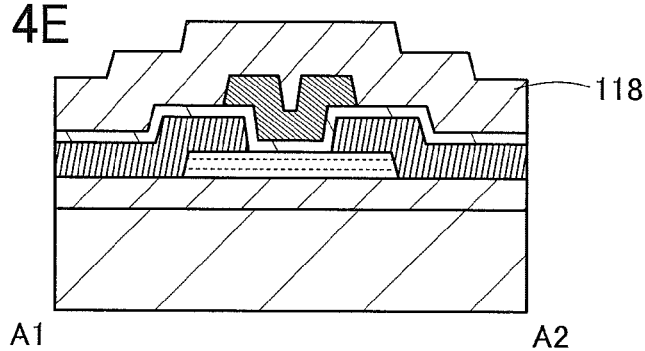

Next, the protective insulating film 118 is formed (see FIG. 4E). The protective insulating film 118 may be formed by a sputtering method, a CVD method, an MBE method, an ALD method, or a PLD method.

Next, third heat treatment is preferably performed. The third heat treatment may be performed under conditions selected from those of the first heat treatment or may be performed at a lower temperature than those of the first and second heat treatment.

Through the above steps, the transistor illustrated in FIGS. 3A to 3C can be manufactured.

<Transistor with Structure 2>

Next, an example of a top-gate top-contact transistor which has a structure different from Transistor with Structure 1 is described.

Figure 5A:
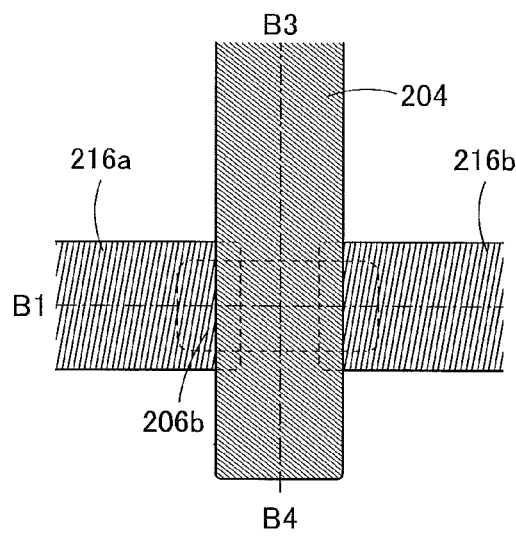
FIG. 5A is a top view illustrating an example of a transistor of one embodiment of the present invention.
Figure 5C:
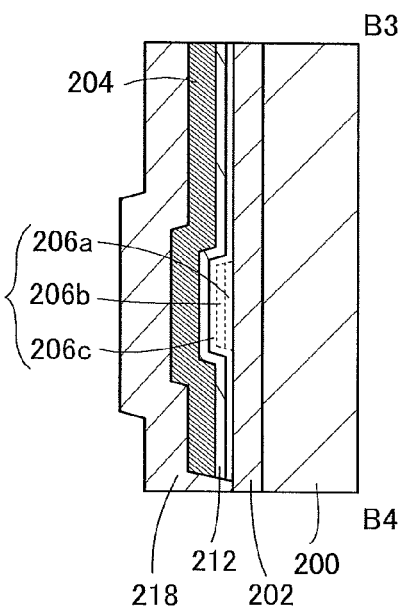
FIGS. 5B and 5C are cross-sectional views thereof.
Figure 5B:
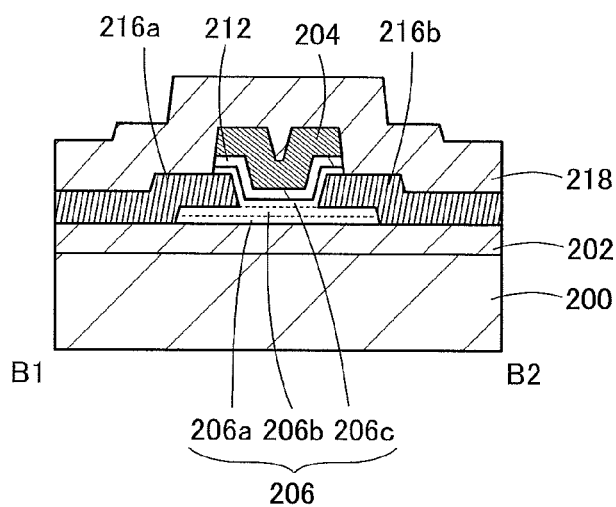

FIGS. 5A to 5C are a top view and cross-sectional views of transistors. FIG. 5A is the top view of the transistor. FIG. 5B is a cross-sectional view taken along dashed-dotted line B1-B2 in FIG. 5A. FIG. 5C is a cross-sectional view taken along dashed-dotted line B3-B4 in FIG. 5A.

The transistor in FIG. 5B includes a base insulating film 202 over a substrate 200; an oxide semiconductor layer 206a over the base insulating film 202; an oxide semiconductor layer 206b over the oxide semiconductor layer 206a; a source electrode 216a and a drain electrode 216b which are in contact with the oxide semiconductor layer 206b; an oxide semiconductor layer 206c over the oxide semiconductor layer 206b, the source electrode 216a, and the drain electrode 216b; a gate insulating film 212 over the oxide semiconductor layer 206c; and a gate electrode 204 over the gate insulating film 212. A protective insulating film 218 is preferably provided over the gate insulating film 212 and the gate electrode 204. Note that the transistor does not necessarily include the base insulating film 202.

The oxide semiconductor layer 206a of the transistor in FIGS. 5A to 5C corresponds to the oxide semiconductor layer S1 in FIGS. 2A to 2B2, for example. The oxide semiconductor layer 206b of the transistor in FIGS. 5A to 5C corresponds to the oxide semiconductor layer S2 in FIGS. 2A to 2B2, for example. The oxide semiconductor layer 206c of the transistor in FIGS. 5A to 5C corresponds to the oxide semiconductor layer S3 in FIGS. 2A to 2B2, for example. Here, the oxide semiconductor layer 206a, the oxide semiconductor layer 206b, and the oxide semiconductor layer 206c are collectively referred to as the multi-layer film 206.

Note that although a multi-layer film corresponding to the multi-layer film in FIGS. 2A to 2B2 is used here, the present invention is not limited to this. For example, a multi-layer film corresponding to the multi-layer film in FIGS. 1A to 1B2 may be used. Further, for example, a multi-layer film including four or more layers may be used. The description of the multi-layer films in FIGS. 1A to 1B2 and FIGS. 2A to 2B2 is referred to for the details of the multi-layer film 206.

FIG. 5A shows a top view in which the gate electrode 204, the gate insulating film 212, and the oxide semiconductor layer 206c have substantially the same top shape (shape seen from the top); however, the shapes are not limited to this. For example, the oxide semiconductor layer 206c or/and the gate insulating film 212 may be provided to extend to the outside of the gate electrode 204.

Depending on the kind of the conductive film used for the source electrode 216a and the drain electrode 216b, oxygen is removed from part of the oxide semiconductor layer 206b or a mixed layer is formed so that n-type regions are formed in the oxide semiconductor layer 206b.

Note that as illustrated in FIG. 5A, the gate electrode 204 is provided such that the edge of the oxide semiconductor layer 206b is located on the inner side of the edge of the gate electrode 204 in the top view. With such a structure, when light irradiation is performed from the gate electrode 204 side, generation of carriers in the oxide semiconductor layer 206b due to light can be prevented. In other words, the gate electrode 204 functions as a light-blocking film. The oxide semiconductor layer 206b may be provided to extend to the outside of the gate electrode 204.

The description of the base insulating film 102 is referred to for the base insulating film 202. The description of the source electrode 116a and the drain electrode 116b are referred to for the source electrode 216a and the drain electrode 216b. The description of the gate insulating film 112 is referred to for the gate insulating film 212. The description of the gate electrode 104 is referred to for the gate electrode 204. The description of the protective insulating film 118 is referred to for the protective insulating film 218. The description of the substrate 100 is referred to for the substrate 200.

<Manufacturing Method of Transistor with Structure 2>

An example of a method for manufacturing Transistor with Structure 2 is described below.

FIGS. 6A to 6D and FIGS. 7A and 7B are cross-sectional views illustrating a method for manufacturing the transistor in FIG. 5B.

First, the substrate 200 is prepared.

Next, the base insulating film 202 is formed. For the base insulating film 202, the description of the method for forming the base insulating film 102 is referred to.

Next, an oxide semiconductor layer to be the oxide semiconductor layer 206a, and an oxide semiconductor layer to be the oxide semiconductor layer 206b are formed in this order. The method for forming the oxide semiconductor layers to be the oxide semiconductor layers 106a and 106b are referred to for the method for forming the oxide semiconductor layers to be the oxide semiconductor layers 206a and 206b.

Next, first heat treatment is preferably performed. The description of the method for manufacturing Transistor with Structure 1 is referred to for the first heat treatment.

Figure 6A:
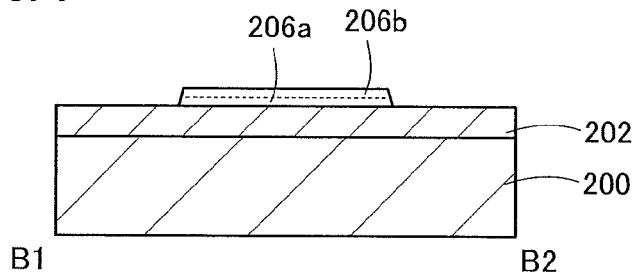
FIGS. 6A to 6D are cross-sectional views illustrating an example of a method for manufacturing a transistor of one embodiment of the present invention.

Next, the oxide semiconductor layers to be the oxide semiconductor layers 206a and 206b are partly etched to form the oxide semiconductor layers 206a and 206b (see FIG. 6A).

Next, a conductive film to be the source electrode 216a and the drain electrode 216b is formed. For the method for forming the conductive film to be the source electrode 216a and the drain electrode 216b, the description of the method for forming the conductive film to be the source electrode 116a and the drain electrode 116b is referred to.

Figure 6B:
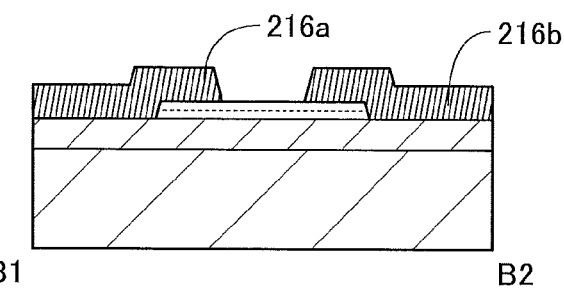

Next, the conductive film to be the source electrode 216a and the drain electrode 216b is partly etched to form the source electrode 216a and the drain electrode 216b (see FIG. 6B).

Then, second heat treatment is preferably performed. The description of the method for manufacturing Transistor with Structure 1 is referred to for the second heat treatment. By second heat treatment, the n-type region of the exposed part of the oxide semiconductor layer 206b can be an i-type region in some cases.

Figure 6C:
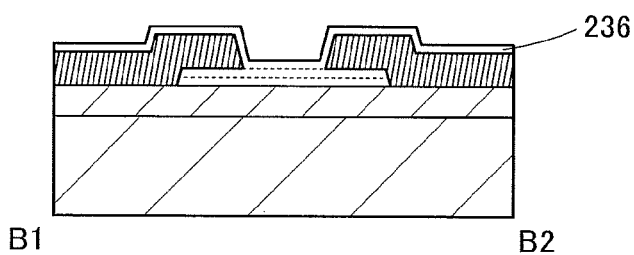

Next, an oxide semiconductor layer 236 to be the oxide semiconductor layer 206c is formed (see FIG. 6C). The description of the oxide semiconductor layer to be the oxide semiconductor layer 106c is referred to for the method for forming the oxide semiconductor layer 236 to be the oxide semiconductor layer 206c.

Next, a base insulating film 242 is formed. For the base insulating film 242, the description of the method for forming the gate insulating film 112 is referred to.

The insulating film 242 may be formed by, for example, a CVD method using plasma. As the substrate temperature increases during CVD, a denser insulating film having a lower defect density can be obtained. The insulating film 242 serves as the gate insulating film 212 after processing, and thus as the insulating film becomes denser and has a lower defect density, the electrical characteristics of the transistor become more stable. When the base insulating film 202 contains excess oxygen, the electrical characteristics of the transistor become stable. However, when the substrate temperature is increased while the base insulating film 202 is exposed, oxygen is released from the base insulating film 202, so that excess oxygen is reduced. Here, the base insulating film 202 is covered with the oxide semiconductor layer to be the oxide semiconductor layer 206c when the insulating film 242 is formed; thus, release of oxygen from the base insulating film 202 can be suppressed. Thus, the insulating film 242 can be a dense insulating film having a low defect density without reducing the excess oxygen contained in the base insulating film 202. For this reason, the reliability of the transistor can be improved.

Figure 6D:
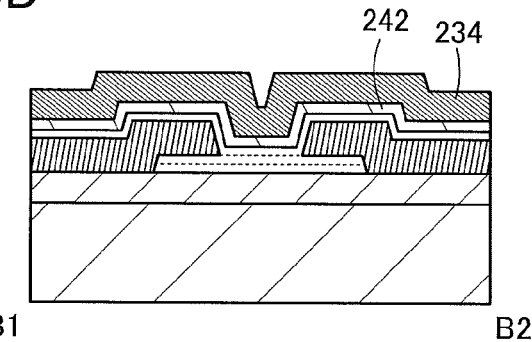

Next, a conductive film 234 is formed (see FIG. 6D). The description of the conductive film to be the gate electrode 104 is referred to for the method for forming the conductive film 234.

Figure 7A:
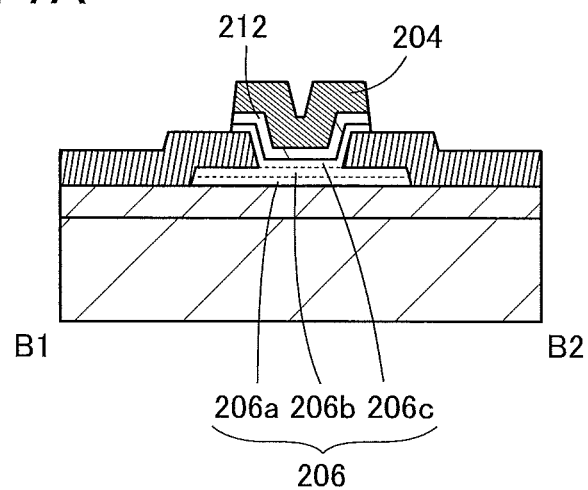
FIGS. 7A and 7B are cross-sectional views illustrating an example of a method for manufacturing a transistor of one embodiment of the present invention.

Next, the oxide semiconductor layer 236 to be the oxide semiconductor layer 206c, the insulating film 242, and the conductive film 234 are partly etched to form the oxide semiconductor layer 206c, the gate insulating film 212, and the gate electrode 204, respectively (see FIG. 7A).

Figure 7B:
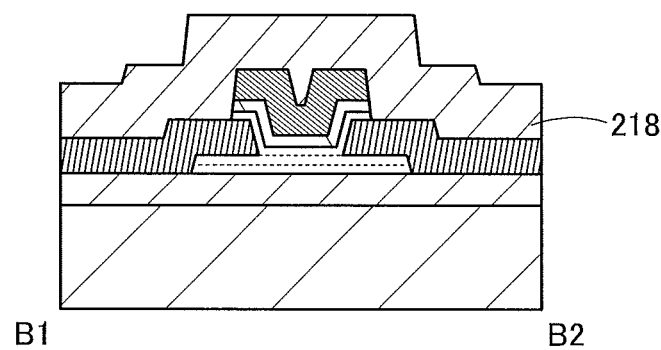

Next, the protective insulating film 218 is formed (see FIG. 7B). For the method for forming the protective insulating film 218, the description of the protective insulating film 118 is referred to.

Next, third heat treatment is preferably performed. The description of the method for manufacturing Transistor with Structure 1 is referred to for the third heat treatment.

Through the above steps, the transistor illustrated in FIGS. 5A to 5C can be manufactured.

<Transistor with Structure 3>

Next, an example of a bottom-gate top-contact transistor is described.

Figure 8A:
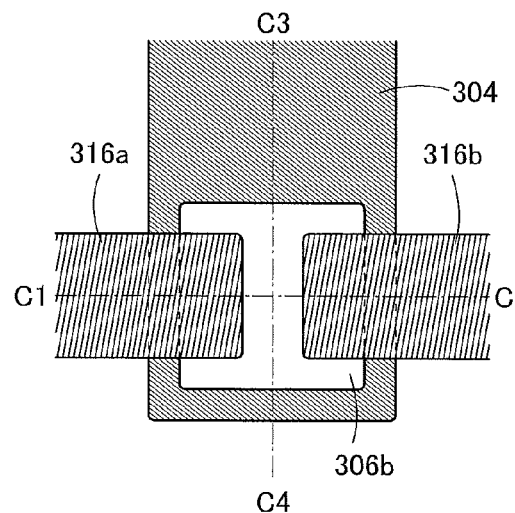
FIG. 8A is a top view illustrating an example of a transistor of one embodiment of the present invention.
Figure 8C:
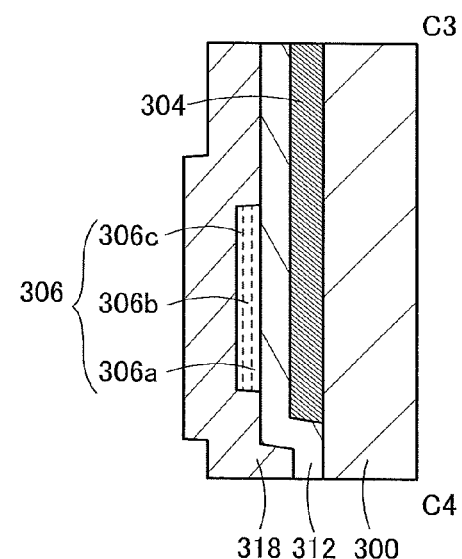
FIGS. 8B to 8D are cross-sectional views thereof.
Figure 8B:
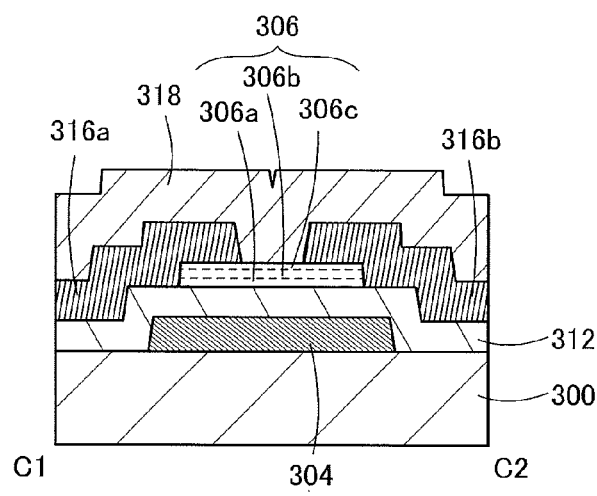

FIGS. 8A to 8D are a top view and cross-sectional views. FIG. 8A is a top view of the transistor. FIG. 8B is a cross-sectional view taken along dashed-dotted line C1-C2 in FIG. 8A. FIG. 8C is a cross-sectional view taken along dashed-dotted line C3-C4 in FIG. 8A.

The transistor in FIG. 8B includes a gate electrode 304 over a substrate 300; a gate insulating film 312 over the gate electrode 304; an oxide semiconductor layer 306a over the gate insulating film 312; an oxide semiconductor layer 306b over the oxide semiconductor layer 306a; an oxide semiconductor layer 306c over the oxide semiconductor layer 306b; and a source electrode 316a and a drain electrode 316b which are in contact with oxide semiconductor layer 306c. A protective insulating film 318 is preferably provided over the oxide semiconductor layer 306c, the source electrode 316a, and the drain electrode 316b.

The oxide semiconductor layer 306a of the transistor in FIGS. 8A to 8D corresponds to the oxide semiconductor layer S3 in FIGS. 2A to 2B2, for example. The oxide semiconductor layer 306b of the transistor in FIGS. 8A to 8D corresponds to the oxide semiconductor layer S2 in FIGS. 2A to 2B2, for example. The oxide semiconductor layer 306c of the transistor in FIGS. 8A to 8D corresponds to the oxide semiconductor layer S1 in FIGS. 2A to 2B2, for example. Here, the oxide semiconductor layer 306a, the oxide semiconductor layer 306b, and the oxide semiconductor layer 306c are collectively referred to as the multi-layer film 306.

Note that although a multi-layer film corresponding to the multi-layer film in FIGS. 2A to 2B2 is used here, the present invention is not limited to this. For example, a multi-layer film corresponding to the multi-layer film in FIGS. 1A to 1B2 may be used. Further, for example, a multi-layer film including four or more layers may be used. The description of the multi-layer films in FIGS. 1A to 1B2 and FIGS. 2A to 2B2 is referred to for the details of the multi-layer film 306.

Depending on the kind of the conductive film used for the source electrode 316a and the drain electrode 316b, oxygen is removed from parts of the oxide semiconductor layers 306b and 306c or a mixed layer is formed so that n-type regions (low-resistance regions) are formed in the oxide semiconductor layer 306b and the oxide semiconductor layer 306c in some cases.

Note that as illustrated in FIG. 8A, the gate electrode 304 is provided such that the edge of the oxide semiconductor layer 306b is located on the inner side of the edge of the gate electrode 304 in the top view. With such a structure, when light irradiation is performed from the gate electrode 304 side, generation of carriers in the oxide semiconductor layer 306b due to light can be prevented. In other words, the gate electrode 304 functions as a light-blocking film. The oxide semiconductor layer 306b may be provided to extend to the outside of the gate electrode 304.

The descriptions of the oxide semiconductor layers 106c, 106b, and 106a are referred to for the oxide semiconductor layers 306a, 306b, and 306c, respectively. That is, the bottom-gate top-contact transistor has a stacked structure which is obtained by turning the stacked structure of the top-gate top-contact transistor upside down.

The protective insulating film 318 may be formed of a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 318 may be, for example, a multilayer film including a silicon oxide layer as a first layer and a silicon nitride layer as a second layer. In this case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of released hydrogen gas or released ammonia gas may be measured by TDS. Further, as the silicon nitride layer, a silicon nitride layer which does not transmit or hardly transmits hydrogen, water, and oxygen is used.

Figure 8D:
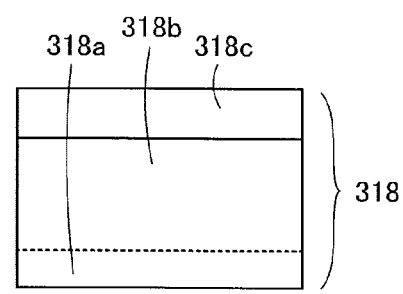

Alternatively, the protective insulating film 318 may be, for example, a multilayer film including a first silicon oxide layer 318a as a first layer, a second silicon oxide layer 318b as a second layer, and a silicon nitride layer 318c as a third layer (see FIG. 8D). In this case, the first silicon oxide layer 318a and/or the second silicon oxide layer 318b may be a silicon oxynitride layer. In addition, the silicon nitride layer may be a silicon nitride oxide layer. As the first silicon oxide layer 318a, a silicon oxide layer whose defect density is low is preferably used. Specifically, a silicon oxide layer whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide layer 318b, a silicon oxide layer containing excess oxygen is used. As the silicon nitride layer 318c, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The insulating film containing excess oxygen is capable of reducing the number of oxygen vacancies in the oxide semiconductor layer 306c.

The description of the source electrode 116a and the drain electrode 116b are referred to for the source electrode 316a and the drain electrode 316b. The description of the gate insulating film 112 is referred to for the gate insulating film 312. The description of the gate electrode 104 is referred to for the gate electrode 304. The description of the substrate 100 is referred to for the substrate 300.

<Manufacturing Method of Transistor with Structure 3>

An example of a method for manufacturing Transistor with Structure 3 is described below.

Figure 9A:
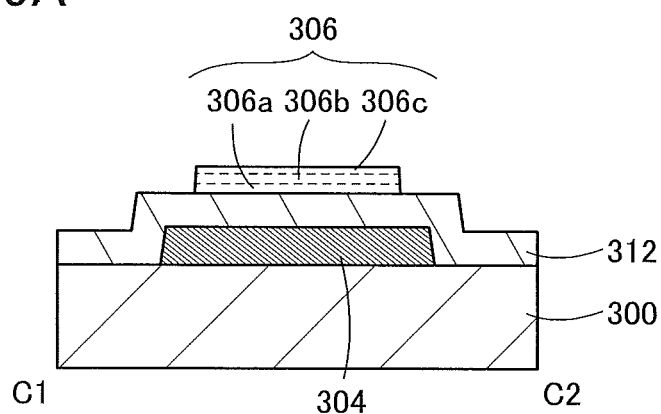
FIGS. 9A to 9C are cross-sectional views illustrating an example of a method for manufacturing a transistor of one embodiment of the present invention.
Figure 9B:
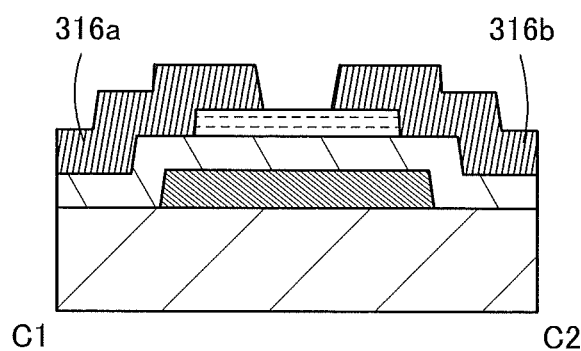
Figure 9C:
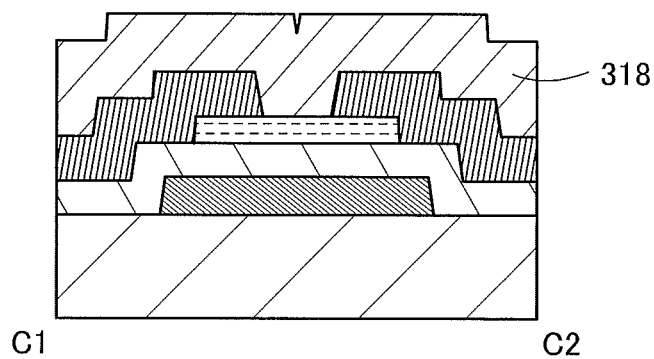

FIGS. 9A to 9C are cross-sectional views illustrating a method for manufacturing the transistor in FIG. 8B.

First, the substrate 300 is prepared.

Next, a conductive film to be the gate electrode 304 is formed. The description of the conductive film to be the gate electrode 104 is referred to for the method for forming the conductive film to be the gate electrode 304.

Next, the conductive film to be the gate electrode 304 is partly etched to form the gate electrode 304.

Next, the gate insulating film 312 is formed. For the gate insulating film 312, the description of the method for forming the gate insulating film 112 is referred to.

The gate insulating film 312 may be formed by, for example, a CVD method using plasma. As the substrate temperature increases during CVD, a denser insulating film having a lower defect density can be obtained. As the gate insulating film 312 becomes denser and has a lower defect density, the electrical characteristics of the transistor become more stable.

Next, an oxide semiconductor layer to be the oxide semiconductor layer 306a, an oxide semiconductor layer to be the oxide semiconductor layer 306b, and an oxide semiconductor layer to be the oxide semiconductor layer 306c are formed in this order. The method for forming the oxide semiconductor layers to be the oxide semiconductor layers 106c, 106b, 106a are referred to for the method for forming the oxide semiconductor layers to be the oxide semiconductor layers 306a, 306b, and 306c, respectively.

Next, first heat treatment is preferably performed. The description of the method for manufacturing Transistor with Structure 1 is referred to for the first heat treatment.

Next, the oxide semiconductor layers to be the oxide semiconductor layers 306a to 306c are partly etched to form the oxide semiconductor layers 306a to 306c (see FIG. 9A).

Next, a conductive film to be the source electrode 316a and the drain electrode 316b is formed. For the method for forming the conductive film to be the source electrode 316a and the drain electrode 316b, the description of the method for forming the conductive film to be the source electrode 116a and the drain electrode 116b is referred to. At this time, a region in the oxide semiconductor layer 306c becomes an n-type region in some cases. The n-type region is formed by damage at the time of forming the conductive film over the oxide semiconductor layer 306c or by oxygen vacancies in the oxide semiconductor layer 306c which are caused by the action of the conductive film. For example, due to entry of hydrogen into sites of the oxygen vacancies, an electron serving as a carrier is generated in some cases.

Next, the conductive film to be the source electrode 316a and the drain electrode 316b is partly etched to form the source electrode 316a and the drain electrode 316b (see FIG. 9B).

Then, second heat treatment is preferably performed. The description of the method for manufacturing Transistor with Structure 1 is referred to for the second heat treatment. By the second heat treatment, the n-type region of the exposed part of the oxide semiconductor layer 306b and/or the oxide semiconductor layer 306c can be an i-type region in some cases.

Next, the protective insulating film 318 is formed (see FIG. 9C).

Here, the case where the protective insulating film 318 has a three-layer structure as illustrated in FIG. 8D is described. First, the first silicon oxide layer 318a is formed, and then the second silicon oxide layer 318b is formed. Then, treatment for adding oxygen ions to the second silicon oxide layer 318b may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Then, the silicon nitride layer 318c is formed. In this manner, the protective insulating film 318 may be formed.

The first silicon oxide layer 318a is preferably formed by a plasma CVD method which is one type of CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidizing gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide layer 318a can be reduced and dangling bonds can be reduced.

In the above manner, the first silicon oxide layer 318a with low defect density is formed. That is, the spin density of the first silicon oxide layer 318a, which is attributed to a signal with a g factor of 2.001 in ESR, can be lower than or equal to $3 \times 10^{17}$ spins/cm$^3$ or lower than or equal to $5 \times 10^{16}$ spins/cm$^3$.

The second silicon oxide layer 318b is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidizing gas are used; and the pressure is set to be higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide layer 318b containing excess oxygen can be formed.

The silicon nitride layer 318c is preferably formed by a plasma CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is set to be higher than or equal to 20 Pa and lower than or equal to 250 Pa, preferably higher than or equal to 40 Pa and lower than or equal to 200 Pa.

Note that the flow rate of the nitrogen gas is 5 to 50 times, preferably 10 to 50 times as high as that of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Through the above method, the silicon nitride layer 318c from which the hydrogen gas and the ammonia gas are less likely to be released can be formed. The silicon nitride layer 318c has low hydrogen content, and thus is dense and does not transmit or hardly transmit hydrogen, water, and oxygen.

The protective insulating film 318 may be formed as described above.

Next, third heat treatment is preferably performed. The description of the method for manufacturing Transistor with Structure 1 is referred to for the third heat treatment.

Through the above steps, the transistor illustrated in FIGS. 8A to 8C can be manufactured.

<Transistor with Structure 4>

Next, an example of a bottom-gate top-contact transistor which has a structure different from Transistor with Structure 3 is described.

Figure 10A:
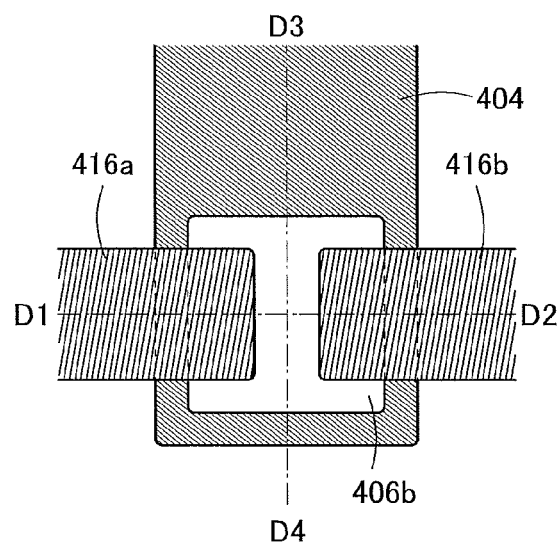
FIG. 10A is a top view illustrating an example of a transistor of one embodiment of the present invention.
Figure 10C:
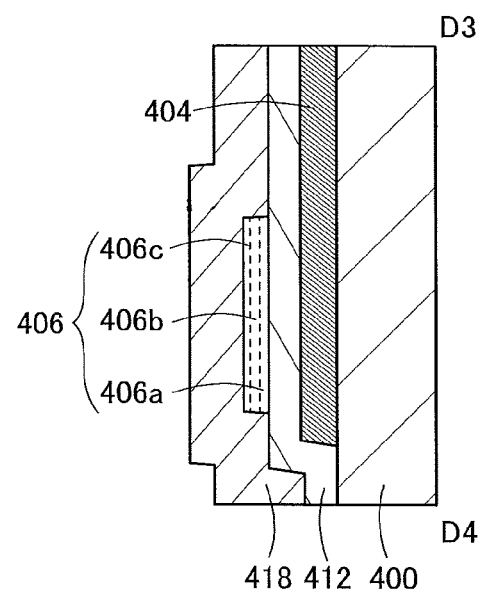
FIGS. 10B and 10C are cross-sectional views thereof.
Figure 10B:
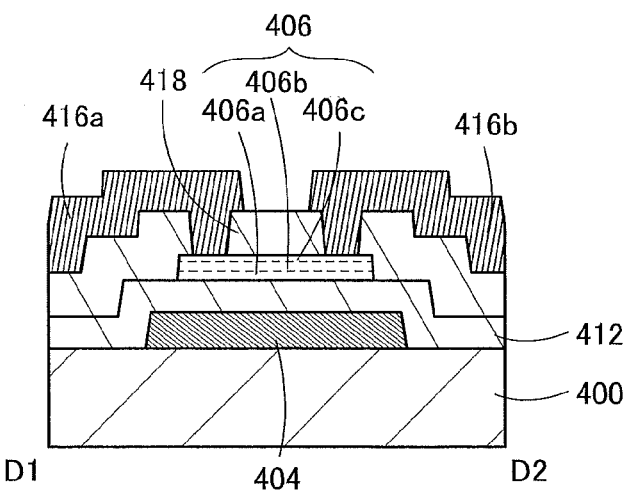

FIGS. 10A to 10C are a top view and cross-sectional views of the transistor. FIG. 10A is the top view of the transistor. FIG. 10B is the cross-sectional view taken along dashed-dotted line D1-D2 in FIG. 10A. FIG. 10C is the cross-sectional view taken along dashed-dotted line D3-D4 in FIG. 10A.

The transistor in FIG. 10B includes a gate electrode 404 over a substrate 400; a gate insulating film 412 over the gate electrode 404; an oxide semiconductor layer 406a over the gate insulating film 412; an oxide semiconductor layer 406b over the oxide semiconductor layer 406a; an oxide semiconductor layer 406c over the oxide semiconductor layer 406b; a protective insulating film 418 over the gate insulating film 412 and the oxide semiconductor layer 406c; and a source electrode 416a and a drain electrode 416b which are in contact with the oxide semiconductor layer 406c through openings provided in the protective insulating film 418.

The oxide semiconductor layer 406a of the transistor in FIGS. 10A to 10C corresponds to the oxide semiconductor layer S3 in FIGS. 2A to 2B2, for example. The oxide semiconductor layer 406b of the transistor in FIGS. 10A to 10C corresponds to the oxide semiconductor layer S2 in FIGS. 2A to 2B2, for example. The oxide semiconductor layer 406c of the transistor in FIGS. 10A to 10C corresponds to the oxide semiconductor layer S1 in FIGS. 2A to 2B2, for example. Here, the oxide semiconductor layer 406a, the oxide semiconductor layer 406b, and the oxide semiconductor layer 406c are collectively-referred to as the multi-layer film 406.

Note that although a multi-layer film corresponding to the multi-layer film in FIGS. 2A to 2B2 is used here, the present invention is not limited to this. For example, a multi-layer film corresponding to the multi-layer film in FIGS. 1A to 1B2 may be used. Further, for example, a multi-layer film including four or more layers may be used. The description of the multi-layer films in FIGS. 1A to 1B2 and FIGS. 2A to 2B2 is referred to for the details of the multi-layer film 406.

Depending on the kind of the conductive film used for the source electrode 416a and the drain electrode 416b, oxygen is removed from parts of the oxide semiconductor layers 406b and 406c or a mixed layer is formed so that n-type regions (low-resistance regions) are formed in the oxide semiconductor layer 406b and the oxide semiconductor layer 406c in some cases.

Note that as illustrated in FIG. 10A, the gate electrode 404 is provided such that the edge of the oxide semiconductor layer 406b is located on the inner side of the edge of the gate electrode 404 in the top view. With such a structure, when light irradiation is performed from the gate electrode 404 side, generation of carriers in the oxide semiconductor layer 406b due to light can be prevented. In other words, the gate electrode 404 functions as a light-blocking film. The oxide semiconductor layer 406b may be provided to extend to the outside of the gate electrode 404.

The descriptions of the oxide semiconductor layers 106c, 106b, and 106a are referred to for the oxide semiconductor layers 406a, 406b, and 406c, respectively. That is, the bottom-gate top-contact transistor has a stacked structure which is obtained by turning the stacked structure of the top-gate top-contact transistor upside down.

For the protective insulating film 418, the description of the protective insulating film 318 is referred to.

The protective insulating film 418 preferably includes an insulating film containing excess oxygen. The insulating film containing excess oxygen is capable of reducing the number of oxygen vacancies in the oxide semiconductor layer 406c.

The description of the source electrode 116a and the drain electrode 116b are referred to for the source electrode 416a and the drain electrode 416b. The description of the gate insulating film 112 is referred to for the gate insulating film 412. The description of the gate electrode 104 is referred to for the gate electrode 404. The description of the substrate 100 is referred to for the substrate 400.

<Manufacturing Method of Transistor with Structure 4>

An example of a method for manufacturing Transistor with Structure 4 is described below.

Figure 11A:
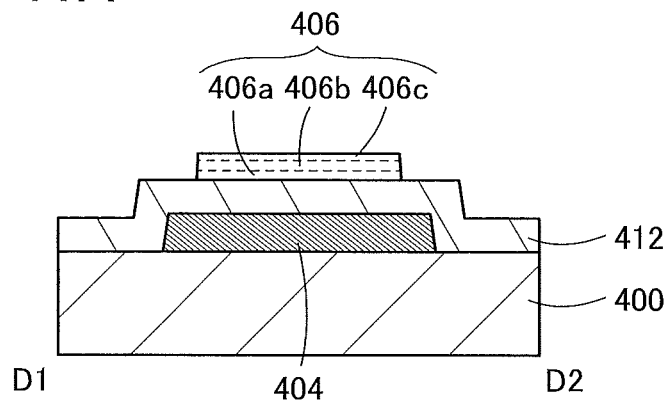
FIGS. 11A to 11C are cross-sectional views illustrating an example of a method for manufacturing a transistor of one embodiment of the present invention.
Figure 11B:
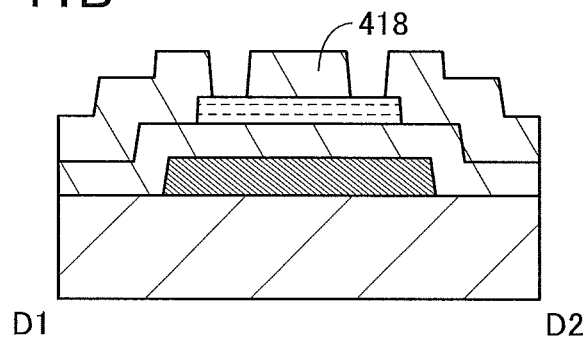
Figure 11C:
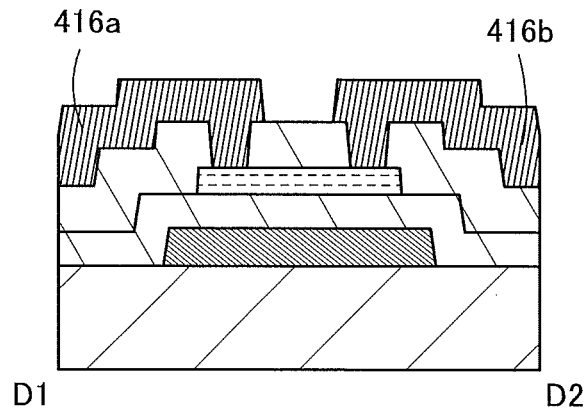

FIGS. 11A to 11C are cross-sectional views illustrating a method for manufacturing the transistor in FIG. 10B.

First, the substrate 400 is prepared.

Next, a conductive film to be the gate electrode 404 is formed. The description of the conductive film to be the gate electrode 104 is referred to for the method for forming the conductive film to be the gate electrode 404.

Next, the conductive film to be the gate electrode 404 is partly etched to form the gate electrode 404.

Next, the gate insulating film 412 is formed. For the gate insulating film 412, the description of the method for forming the gate insulating film 112 is referred to.

The gate insulating film 412 may be formed by, for example, a CVD method using plasma. As the substrate temperature increases during CVD, a denser insulating film having a lower defect density can be obtained. As the gate insulating film 412 becomes denser and has a lower defect density, the electrical characteristics of the transistor become more stable.

Next, an oxide semiconductor layer to be the oxide semiconductor layer 406a, an oxide semiconductor layer to be the oxide semiconductor layer 406b, and an oxide semiconductor layer to be the oxide semiconductor layer 406c are formed in this order. The method for forming the oxide semiconductor layers to be the oxide semiconductor layers 106c, 106b, 106a are referred to for the method for forming the oxide semiconductor layers to be the oxide semiconductor layers 406a, 406b, and 406c, respectively.

Next, first heat treatment is preferably performed. The description of the method for manufacturing Transistor with Structure 1 is referred to for the first heat treatment.

Next, the oxide semiconductor layers to be the oxide semiconductor layers 406a to 406c are partly etched to form the oxide semiconductor layers 406a to 406c (see FIG. 11A).

Next, an insulating film to be the protective insulating film 418 is formed. For the method for forming the insulating film to be the protective insulating film 418, the description of the protective insulating film 318 is referred to.

Then, second heat treatment is preferably performed. The description of the method for manufacturing Transistor with Structure 1 is referred to for the second heat treatment.

Next, the insulating film to be the protective insulating film 418 is partly etched, so that the protective insulating film 418 is formed (see FIG. 11B).

Next, a conductive film to be the source electrode 416a and the drain electrode 416b is formed. For the method for forming the conductive film to be the source electrode 416a and the drain electrode 416b, the description of the method for forming the conductive film to be the source electrode 116a and the drain electrode 116b is referred to. At this time, a region in the oxide semiconductor layer 406c becomes an n-type region in some cases. The n-type region is formed by damage at the time of forming the conductive film over the oxide semiconductor layer 406c or by oxygen vacancies in the oxide semiconductor layer 406c which are caused by the action of the conductive film. For example, due to entry of hydrogen into sites of the oxygen vacancies, an electron serving as a carrier is generated in some cases.

Next, the conductive film to be the source electrode 416a and the drain electrode 416b is partly etched to form the source electrode 416a and the drain electrode 416b (see FIG. 11C).

Next, third heat treatment is preferably performed. The description of the method for manufacturing Transistor with Structure 1 is referred to for the third heat treatment.

Through the above steps, the transistor illustrated in FIGS. 10A to 10C can be manufactured.

<Application Product>

Application products using the above transistor are described below.

<Microcomputer>

The transistor described above can be applied to microcomputers which are mounted on variety of electronic devices.

A structure and operation of a fire alarm that is an example of the electronic device using a microcomputer are described with reference to FIG. 12 and FIGS. 13A and 13B.

A fire alarm in this specification refers to any device which raises an alarm over fire occurrence instantly, and for example, a residential fire alarm, an automatic fire alarm system, and a fire detector used for the automatic fire alarm system are included in its category.

Figure 12:
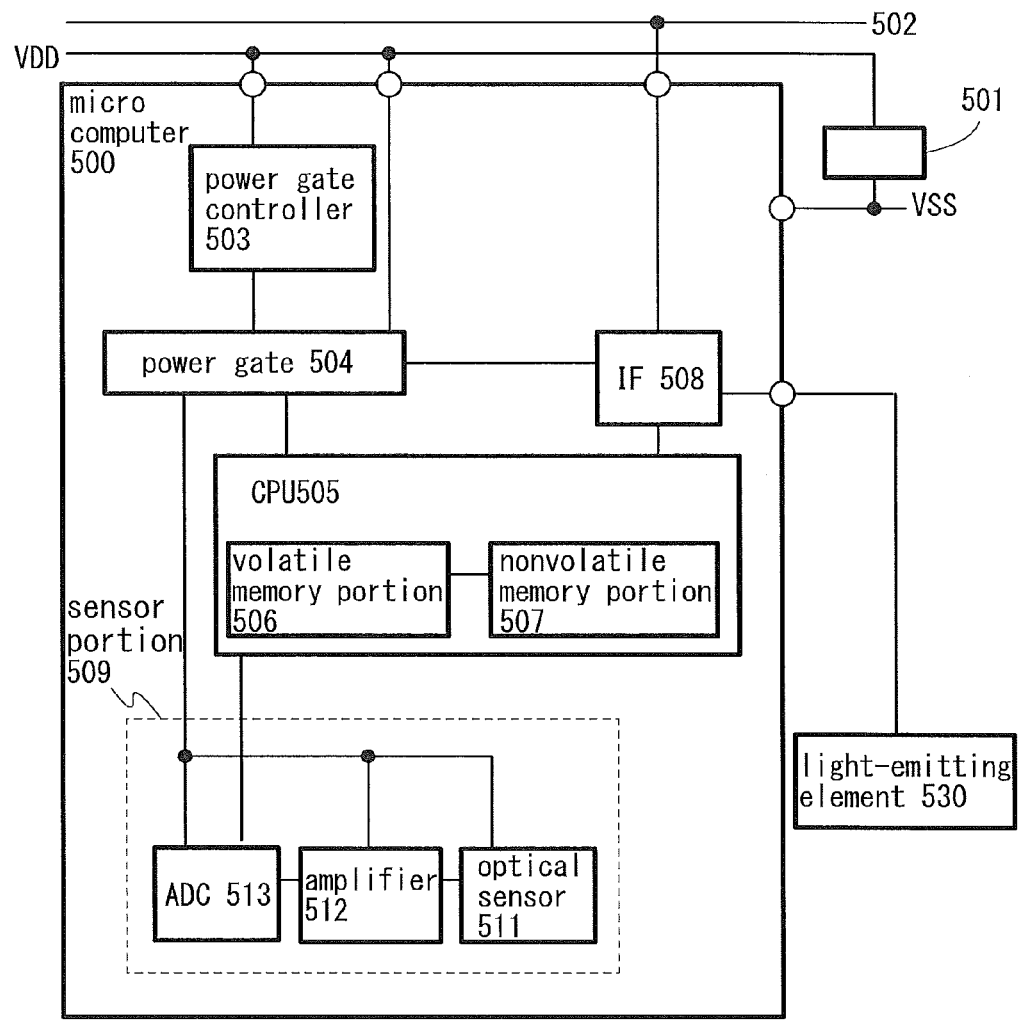
FIG. 12 is a block diagram illustrating a semiconductor device of one embodiment of the present invention.

An alarm device illustrated in FIG. 12 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I$^2$C bus can be used, for example. A light-emitting element 530 electrically connected to the power gate 504 through the interface 508 is provided in the alarm device.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 504, it is preferable to use a transistor which has an extremely low off-state current and is used for the nonvolatile memory portion 507, for example, the above transistor which includes a multilayer film including an oxide semiconductor layer. With the use of such a transistor, a leakage current can be reduced when supply of power is stopped by the power gate 504, so that a reduction in power consumption of the alarm device can be achieved.

A direct-current power source 501 may be provided in the alarm device so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery is provided in a housing. Note that the alarm device does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 13A:
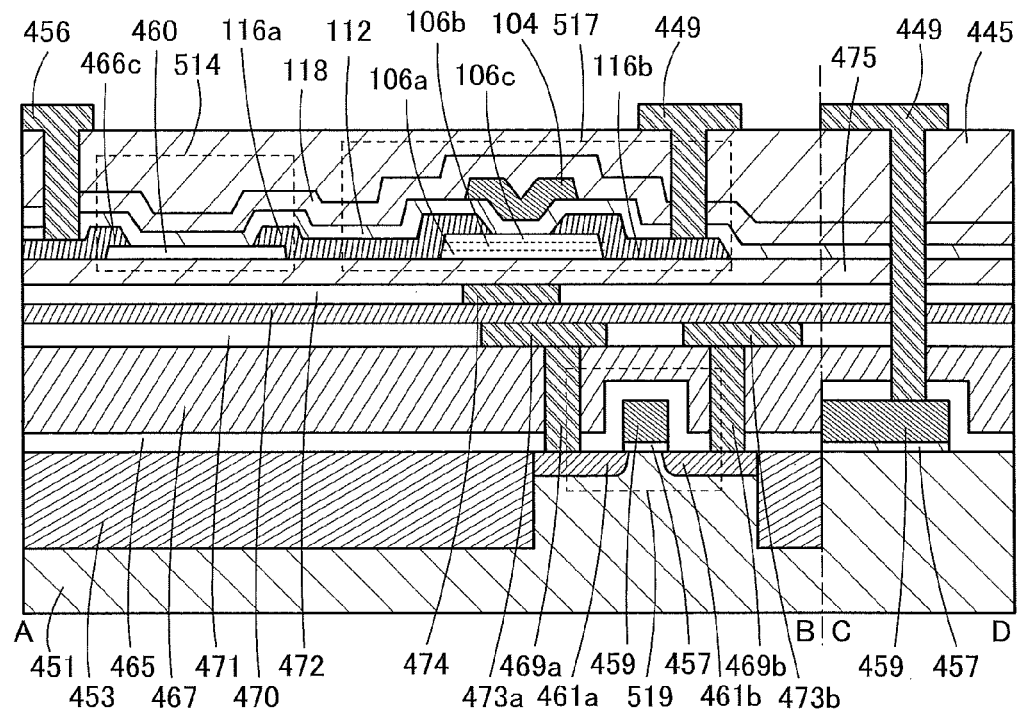
FIG. 13A is a cross-sectional view illustrating an example of a semiconductor device of one embodiment of the present invention.

FIG. 13A illustrates part of the cross section of the alarm device. In FIG. 13A, the cross section taken along A-B in the channel length direction and the cross section taken along C-D perpendicular to the channel length direction are illustrated. In the alarm device, element isolation regions 453 are formed in a p-type semiconductor substrate 451, and a transistor 519 including a gate insulating film 457, a gate electrode 459, n-type impurity regions 461a and 461b, an insulating film 465, and an insulating film 467 is formed. Here, the transistor 519 is formed using a semiconductor such as single crystal silicon, so that the transistor 519 can operate at high speed. Accordingly, a volatile memory portion of a CPU that can achieve high-speed access can be formed.

In addition, contact plugs 469a and 469b are formed in openings which are formed by partly etching the insulating films 465 and 467, and an insulating film 471 having groove portions is formed over the insulating film 467 and the contact plugs 469a and 469b. Wirings 473a and 473b are formed in the groove portions of the insulating film 471. An insulating film 470 is formed over the insulating film 471 and the wirings 473a and 473b by a sputtering method, a CVD method, or the like, and an insulating film 472 having a groove portion is formed over the insulating film 470. An electrode 474 is formed in the groove portion of the insulating film 472. The electrode 474 functions as a back gate electrode of a transistor 517. The electrode 474 can control the threshold voltage of the transistor 517.

Moreover, an insulating film 475 is formed over the insulating film 472 and the electrode 474 by a sputtering method, a CVD method, or the like.

The transistor 517 and a photoelectric conversion element 514 are provided over the insulating film 475. The transistor 517 includes an oxide semiconductor layer 106a, an oxide semiconductor layer 106b, and an oxide semiconductor layer 106c; a source electrode 116a and a drain electrode 116b; a gate insulating film 112; a gate electrode layer 104; and a protective insulating film 118. Moreover, an insulating film 445 covers the photoelectric conversion element 514 and the transistor 517, and a wiring 449 is formed over the insulating film 445 so as to be in contact with the drain electrode 116b. The wiring 449 electrically connects the drain electrode 116b of the transistor 517 to the gate electrode 459 of the transistor 519.

Figure 13B:
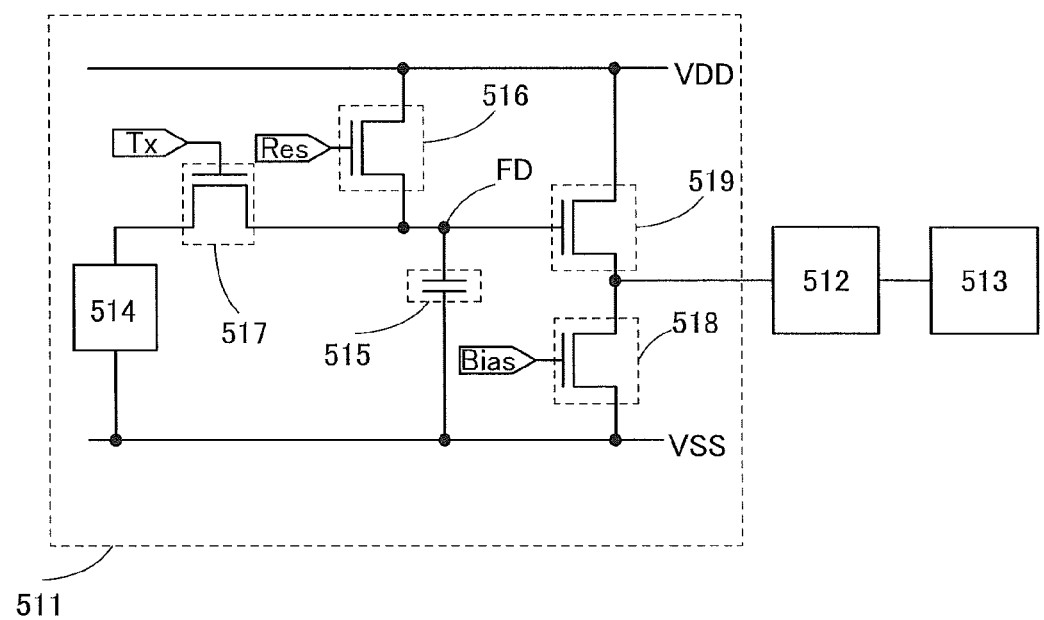
FIG. 13B is a circuit diagram thereof.

FIG. 13B is a circuit diagram of a detection portion. The detection portion includes the optical sensor 511, the amplifier 512, and the AD converter 513. The optical sensor 511 includes the photoelectric conversion element 514, a capacitor 515, a transistor 516, the transistor 517, a transistor 518, and the transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the transistor 517. The gate electrode of the transistor 517 is supplied with an electric charge accumulation control signal Tx, and the other of the source electrode and the drain electrode thereof is electrically connected to one of a pair of electrodes of the capacitor 515, one of a source electrode and a drain electrode of the transistor 516, and the gate electrode of the transistor 519 (hereinafter the node is referred to as a node FD in some cases). The other of the pair of electrodes of the capacitor 515 is electrically connected to the low potential power supply line VSS. A gate electrode of the transistor 516 is supplied with a reset signal Res, and the other of the source electrode and the drain electrode thereof is electrically connected to the high potential power supply line VDD. One of a source electrode and a drain electrode of the transistor 519 is electrically connected to one of a source electrode and a drain electrode of the transistor 518 and the amplifier 512. The other of the source electrode and the drain electrode of the transistor 519 is electrically connected to the high potential power supply line VDD. A gate electrode of the transistor 518 is supplied with a bias signal Bias, and the other of the source electrode and the drain electrode thereof is electrically connected to the low potential power supply line VSS.

Note that the capacitor 515 is not necessarily provided. For example, in the case where parasitic capacitance of the transistor 519 or the like is sufficiently large, a structure without the capacitor may be employed.

Further, as each of the transistor 516 and the transistor 517, the transistor having an extremely low off-state current is preferably used. As the transistor having an extremely low off-state current, the above transistor is preferably used. With such a structure, the potential of the node FD can be held for a long time.

In the structure in FIG. 13A, the photoelectric conversion element 514 is electrically connected to the transistor 517 and is provided over the insulating film 475.

The photoelectric conversion element 514 includes a semiconductor film 460 provided over the insulating film 475, and the source electrode 116a and an electrode 466c which are in contact with a top surface of the semiconductor film 460. The source electrode 116a is an electrode functioning as the source electrode or the drain electrode of the transistor 517 and electrically connects the photoelectric conversion element 514 to the transistor 517.

Over the semiconductor film 460, the source electrode 116a, and the electrode 466c, the gate insulating film 112, the protective insulating film 118, and the insulating film 445 are provided. Further, a wiring 456 is provided over the insulating film 445 and is in contact with the electrode 466c through an opening provided in the gate insulating film 112, the protective insulating film 118, and the insulating film 445.

The electrode 466c can be formed in steps similar to those of the source electrode 116a and the drain electrode 116b, and the wiring 456 can be formed in steps similar to those of the wiring 449.

As the semiconductor film 460, a semiconductor film which can perform photoelectric conversion is provided, and for example, silicon or germanium can be used. In the case of using silicon, the semiconductor film 460 functions as an optical sensor which senses visible light. Further, there is a difference, between silicon and germanium, in wavelengths of electromagnetic waves that can be absorbed. When the semiconductor film 460 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced.

In the above-described fire alarm, the CPU 505 in which a plurality of circuits including any of the above transistors are combined and mounted on one IC chip is used.

<CPU>

Figure 14A:
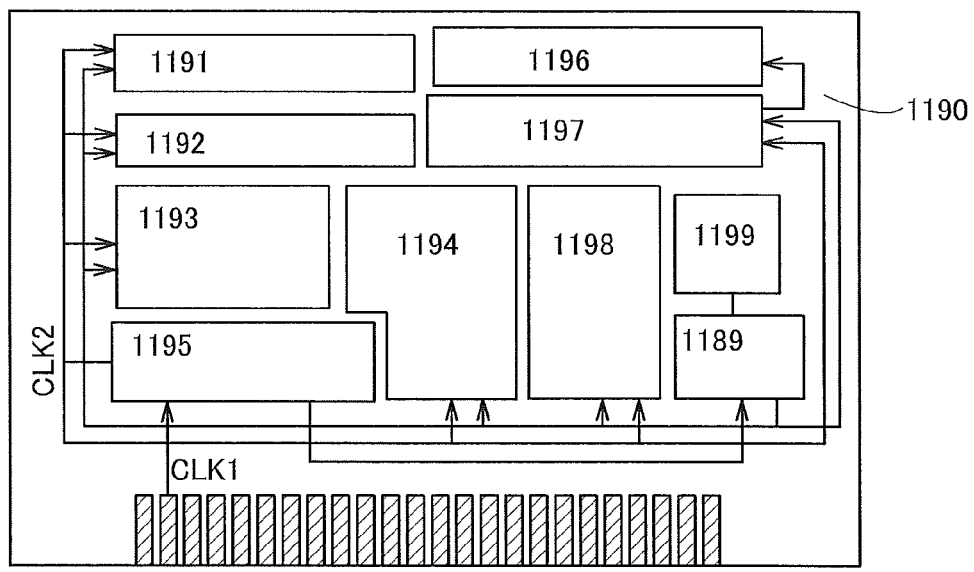
FIGS. 14A to 14C are block diagrams illustrating examples of CPUs of one embodiment of the present invention.
Figure 14B:
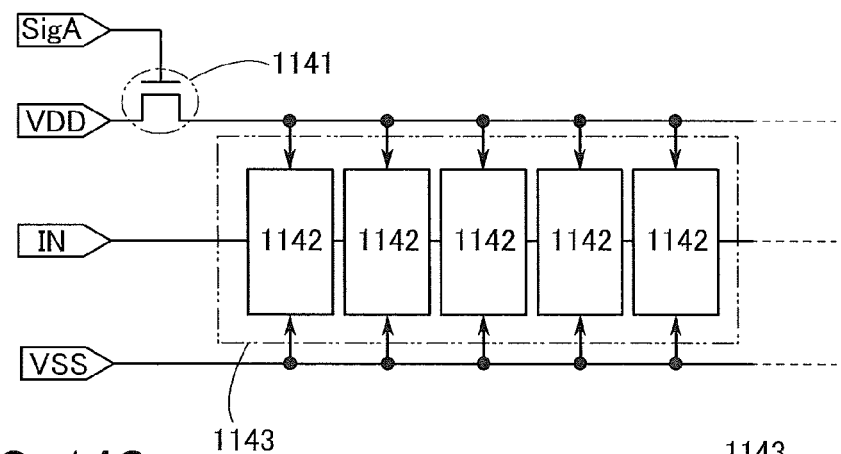
Figure 14C:
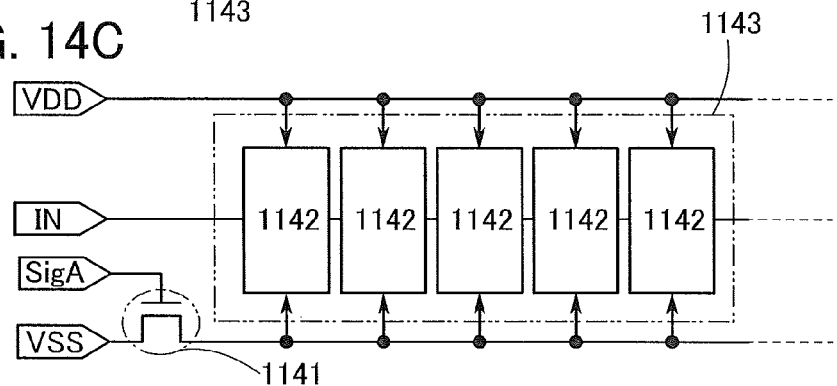

FIGS. 14A to 14C are block diagrams illustrating a specific configuration of a CPU at least partly including any of the above transistors.

The CPU illustrated in FIG. 14A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 14A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 14A, a memory cell is provided in the register 1196. As the memory cell of the register 1196, any of the above transistors can be used.

In the CPU illustrated in FIG. 14A, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 14B or FIG. 14C. Circuits illustrated in FIGS. 14B and 14C are described below.

FIGS. 14B and 14C each illustrate a memory device in which any of the above transistors is used as a switching element which controls supply of a power supply potential to a memory cell.

The memory device illustrated in FIG. 14B includes a switching element 1141 and a memory cell group 1143 including a plurality of memory cells 1142. Specifically, as each of the memory cells 1142, any of the above transistors can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 14B, any of the above transistors is used as the switching element 1141, and the switching of the transistor is controlled by a signal SigA supplied to a gate electrode layer thereof.

Note that FIG. 14B illustrates the configuration in which the switching element 1141 includes only one transistor; however, one embodiment of the present invention is not particularly limited to such configuration and the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 14B, the switching element 1141 may control the supply of the low-level power supply potential VSS.

In FIG. 14C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be retained even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, any of the above transistors can also be applied to an LSI such as a digital signal processor (DSP), a custom LSI, or a field programmable gate array (FPGA).

<Display Device>

In this section, a display device including any of the above transistors is described.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by current or voltage, specifically an inorganic electroluminescent (EL) element, an organic EL element, and the like. Furthermore, a display medium whose contrast is changed by an electric effect, such as electronic ink or an electrophoretic element, can be used as the display element. A display device including an EL element and a display device including a liquid crystal element are described below as examples of the display device.

The display device described below includes in its category a panel in which a display element is sealed, and a module in which an IC such as a controller or the like is mounted on the panel.

The display device described below also refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

<EL Display Device>

First, a display device including an EL element (also referred to as an EL display device) is described.

Figure 15A:
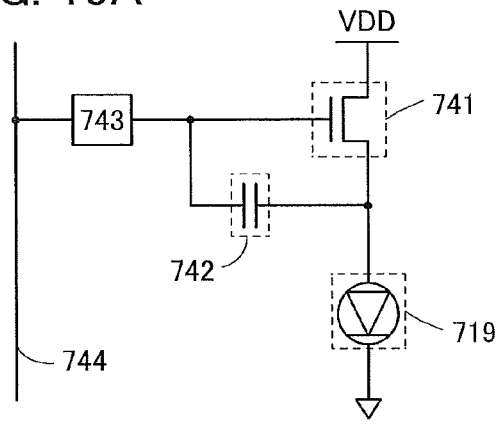
FIG. 15A is a circuit diagram illustrating an example of an EL display device of one embodiment of the present invention.

FIG. 15A is an example of the circuit diagram of a pixel of an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the invention in which a function of a circuit is specified is disclosed in this specification and the like, in some cases. Therefore, when a connection portion of a circuit is specified, the circuit is disclosed as one embodiment of the invention even when a function of the circuit is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device shown in FIG. 15A includes a switching element 743, a transistor 741, a capacitor 742, and a light-emitting element 719.

Note that FIG. 15A and the like each illustrate a circuit configuration example; thus, a transistor can be additionally provided. In each node in FIG. 15A, it is also possible not to provide an additional transistor, switch, passive element, or the like.

A gate of the transistor 741 is electrically connected to one terminal of the switching element 743 and one terminal of the capacitor 742. A source of the transistor 741 is electrically connected to the other terminal of the capacitor 742 and one terminal of the light-emitting element 719. A power supply potential VDD is supplied to a drain of the transistor 741. The other terminal of the switching element 743 is electrically connected to a signal line 744. A constant potential is supplied to the other terminal of the light-emitting element 719. The constant potential is a ground potential GND or a potential lower than the ground potential GND.

The above transistor is used as the transistor 741. The transistor has stable electrical characteristics. Accordingly, an EL display device having high display quality can be provided.

It is preferable to use a transistor as the switching element 743. When the transistor is used as the switching element, the area of a pixel can be reduced, so that the EL display device can have high resolution. Alternatively, the above transistor may be used as the switching element 743; accordingly, the switching element 743 can be formed by the same process as the transistor 741, which leads to an improvement in the productivity of the EL display device.

Figure 15B:
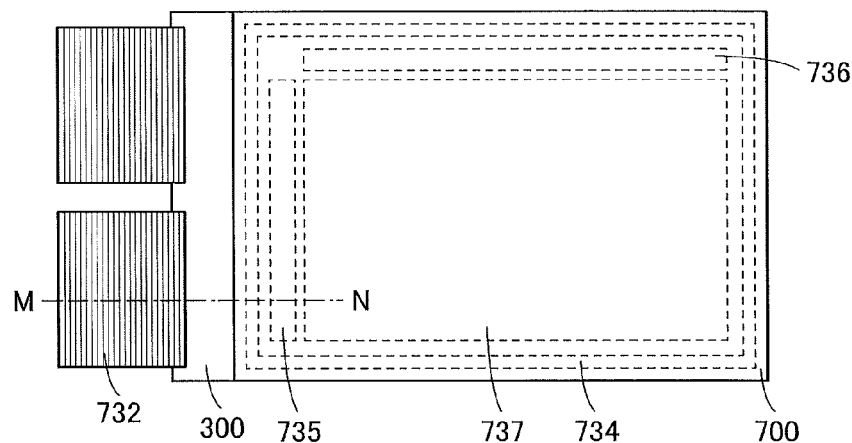
FIG. 15B is a top view thereof.

FIG. 15B is a top view of the EL display device. The EL display device includes the substrate 300, a substrate 700, a seal material 734, a driver circuit 735, a driver circuit 736, a pixel 737, and an FPC 732. The seal material 734 is provided between the substrate 300 and the substrate 700 so as to surround the pixel 737, the driver circuit 735, and the driver circuit 736. The driver circuit 735 and/or the driver circuit 736 may be provided outside the seal material 734.

Figure 15C:
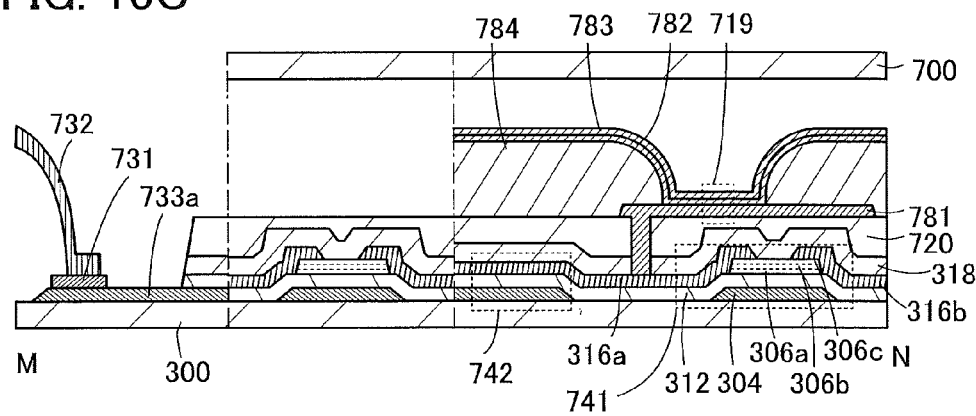
FIG. 15C is a cross-sectional view thereof.

FIG. 15C illustrates part of a cross-sectional view of the EL display device taken along dashed-dotted line M-N in FIG. 15B. The FPC 732 is connected to a wiring 733a through a terminal 731. The wiring 733a is formed in the same layer as the gate electrode 304.

FIG. 15C illustrates the example in which the transistor 741 and the capacitor 742 are provided in the same plane. With such a structure, the capacitor 742 can be formed in the same planes as the gate electrode, the gate insulating film, and the source (drain) electrode of the transistor 741. Such provision of the transistor 741 and the capacitor 742 in the same plane leads to shortening of the manufacturing process of the EL display device and an improvement of the productivity.

FIG. 15C illustrates the example in which a transistor having a structure similar to that of the transistor illustrated in FIGS. 8A to 8D is applied to the transistor 741.

The transistor illustrated in FIGS. 8A to 8D is a transistor with a small shift in threshold voltage. Accordingly, the transistor is preferred for EL display devices where gray scales are varied even with the small shift of the threshold voltage.

An insulating film 720 is provided over the transistor 741 and the capacitor 742. Here, an opening reaching the source electrode 316a of the transistor 741 is provided in the insulating film 720 and the protective insulating film 318.

An electrode 781 is provided over the insulating film 720. The electrode 781 is in contact with the source electrode 316a of the transistor 741 though the opening provided in the insulating film 720 and the protective insulating film 318.

Over the electrode 781, a bank 784 having an opening reaching the electrode 781 is provided. Over the bank 784, a light-emitting layer 782 in contact with the electrode 781 through the opening provided in the bank 784 is provided. An electrode 783 is provided over the light-emitting layer 782. A region where the electrode 781, the light-emitting layer 782, and the electrode 783 overlap with one another serves as the light-emitting element 719.

<Liquid Crystal Display Device>

Next, a display device including a liquid crystal element (also referred to as a liquid crystal display device) is described.

Figure 16A:
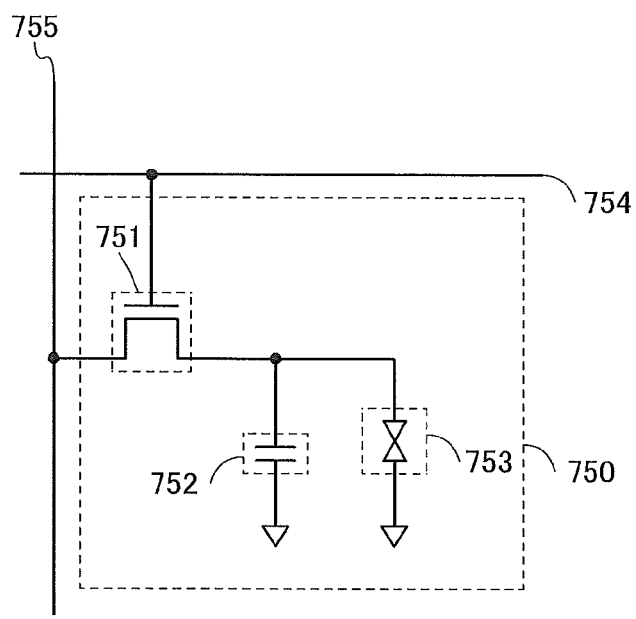
FIG. 16A is a circuit diagram illustrating an example of a liquid crystal display device of one embodiment of the present invention.

FIG. 16A is a circuit diagram illustrating a configuration example of the pixel of a liquid crystal display device. A pixel 750 shown in FIG. 16A includes a transistor 751, a capacitor 752, and an element (hereinafter also referred to as liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the wiring electrically connected to the other electrode of the liquid crystal element 753.

Figure 16B:
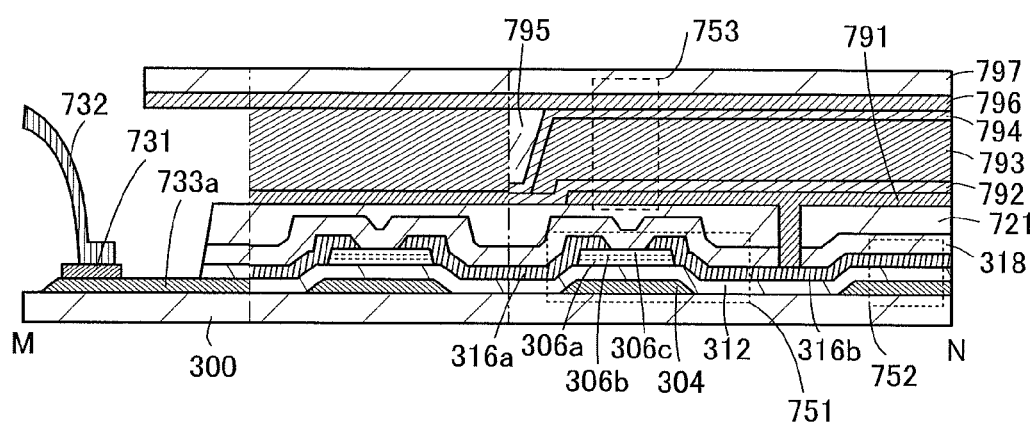
FIG. 16B is a cross-sectional view thereof.

The top view of the liquid crystal display device is similar to that of the EL display device. FIG. 16B illustrates part of a cross-sectional view of the liquid crystal display device taken along dashed-dotted line M-N in FIG. 15B. In FIG. 16B, the FPC 732 is connected to the wiring 733a through the terminal 731. The wiring 733a is formed in the same layer as the gate electrode 304.

FIG. 16B illustrates the example in which the transistor 751 and the capacitor 752 are provided in the same plane. With such a structure, the capacitor 752 can be formed in the same planes as the gate electrode, the gate insulating film, and the source (drain) electrode of the transistor 751. Such provision of the transistor 751 and the capacitor 752 in the same plane leads to shortening of the manufacturing process of the liquid crystal display device and an improvement of the productivity.

Any of the above transistors can be applied to the transistor 751. FIG. 16B illustrates the example in which a transistor having a structure similar to that of the transistor illustrated in FIGS. 8A to 8D is applied.

The off-state current of the transistor 751 can be made extremely small. Therefore, charge stored in the capacitor 752 is unlikely to leak, so that the voltage applied to the liquid crystal element 753 can be maintained for a long period. Accordingly, the transistor 751 can be kept off during a period in which moving images with few motions or a still image are/is displayed, whereby power for the operation of the transistor 751 can be saved in that period; accordingly a liquid crystal display device with low power consumption can be provided.

An insulating film 721 is provided over the transistor 751 and the capacitor 752. Here, an opening reaching the drain electrode 316b of the transistor 751 is provided in the insulating film 721 and the protective insulating film 318.

An electrode 791 is provided over the insulating film 721. The electrode 791 is in contact with the drain electrode 316b of the transistor 751 though the opening provided in the insulating film 721 and the protective insulating film 318.

An insulating film 792 which functions as an alignment film is provided over the electrode 791. A liquid crystal layer 793 is provided over the insulating film 792. An insulating film 794 which functions as an alignment film is provided over the liquid crystal layer 793. A spacer 795 is provided over the insulating film 794. An electrode 796 is provided over the spacer 795 and the insulating film 794. A substrate 797 is provided over the electrode 796.

<Installation Example>

Figure 17A:
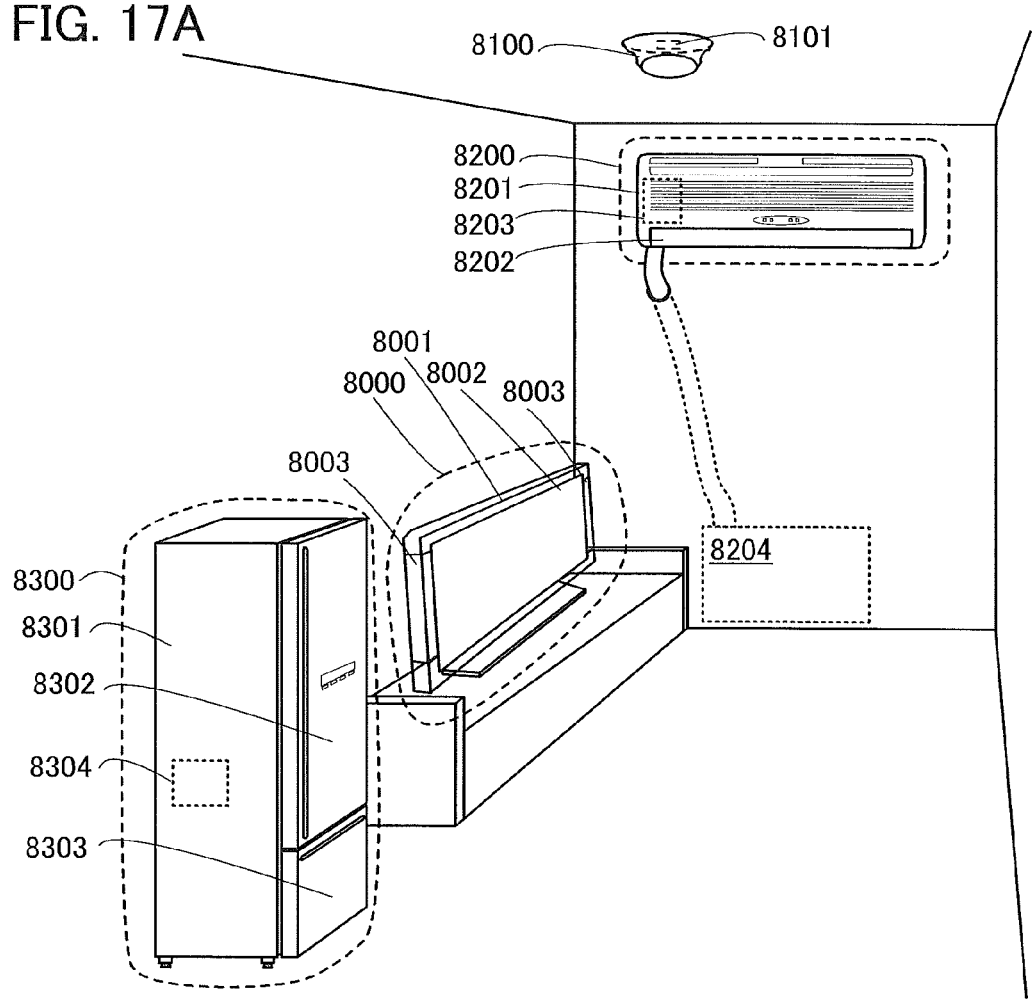
FIGS. 17A to 17C illustrate examples of electronic devices of one embodiment of the present invention.

In a television set 8000 in FIG. 17A, a display portion 8002 is incorporated in a housing 8001. The display portion 8002 displays an image and a speaker portion 8003 can output sound. The above display device can be used for the display portion 8002.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a memory or a CPU for performing information communication. The above memory or CPU can be used for the television set 8000.

In FIG. 17A, an alarm device 8100 is a residential fire alarm, which includes a sensor portion and a microcomputer 8101. Note that the microcomputer 8101 includes a CPU in which any of the above transistors is used.

In FIG. 17A, an air conditioner which includes an indoor unit 8200 and an outdoor unit 8204 includes the CPU in which any of the above transistors is used. Specifically, the indoor unit 8200 includes a housing 8201, an air outlet 8202, a CPU 8203, and the like. Although the CPU 8203 is provided in the indoor unit 8200 in FIG. 17A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 17A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 17A, the CPU 8304 is provided in the housing 8301. When the electric refrigerator-freezer 8300 includes the CPU 8304 in which the above transistor is used, a reduction in power consumption of the electric refrigerator-freezer 8300 can be achieved.

Figure 17B:
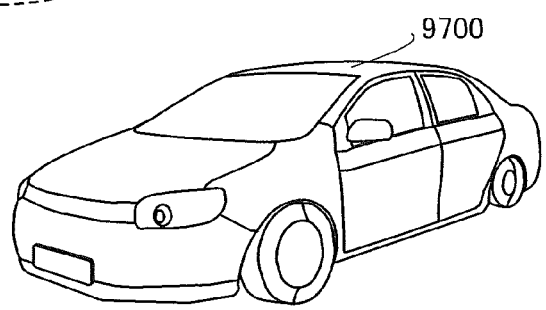
Figure 17C:
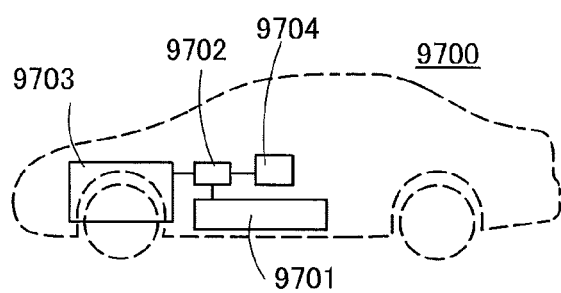

FIGS. 17B and 17C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of this embodiment can be freely combined with, applied to, or replaced with another part of this embodiment.

Example 1

In this example, a transistor including a multi-layer film is formed, and the electrical characteristics of the transistor are measured.

The structure of the transistor formed as a sample is the same as that in FIGS. 8A to 8D. Thus, the structure and manufacturing method of the transistor are described below with reference to FIGS. 8A to 8D and FIGS. 9A to 9C.

A glass substrate was used as the substrate 300 of the sample. A 100-nm-thick tungsten film was used as the gate electrode 304. A multi-layer film in which a 400-nm-thick silicon nitride film and a 50-nm-thick silicon oxynitride film were stacked were used as the gate insulating film 312. A multi-layer film in which a 50-nm-thick titanium film, a 400-nm-thick aluminum film, and a 100-nm-thick titanium film were stacked were used as the source electrode 316a and the drain electrode 316b. A 450-nm-thick silicon oxynitride film was used as the protective insulating film 318.

The multi-layer film 306 which is Example Sample of one embodiment of the present invention is described below.

A five-nm-thick In—Ga—Zn oxide film was used as the oxide semiconductor layer 306a of Example Sample. The oxide semiconductor layer 306a was formed by a sputtering method under the following conditions: a target having an atomic ratio of In:Ga:Zn=1:1:1 was used; an AC power of 5 kW was supplied; only oxygen was used as a deposition gas; the pressure was 0.6 Pa; and the substrate temperature was 170° C.

A 10-nm-thick In—Ga—Zn oxide film was used as the oxide semiconductor layer 306b. The oxide semiconductor layer 306b was formed by a sputtering method under the following conditions: a target having an atomic ratio of In:Ga:Zn=1:1:1 was used; an AC power of 5 kW was supplied; only argon was used as a deposition gas; the pressure was 0.6 Pa; and the substrate temperature was 170° C.

A 20-nm-thick In—Ga—Zn oxide film was used as the oxide semiconductor layer 306c. The oxide semiconductor layer 306c was formed by a sputtering method under the following conditions: a target having an atomic ratio of In:Ga:Zn=1:1:1 was used; an AC power of 5 kW was supplied; only oxygen was used as a deposition gas; the pressure was 0.6 Pa; and the substrate temperature was 170° C.

In the multi-layer film 306 of Example Sample, an oxide semiconductor layer having a small number of oxygen vacancies (a large proportion of oxygen) was used for each of the oxide semiconductor layers 306a and 306c, and an oxide semiconductor layer having a large number of oxygen vacancies (a small proportion of oxygen) was used for the oxide semiconductor layer 306b. Thus, when the transistor was turned on, the oxide semiconductor layer 306b had the highest current density in the multi-layer film 306. Therefore, the transistor is expected to have high field-effect mobility because carrier transfer is unlikely to be inhibited at the interfaces between the gate insulating film 312 and the oxide semiconductor layer 306a and between the oxide semiconductor layer 306c and the protective insulating film 318.

For comparison, Comparison Sample which is a transistor including a single oxide semiconductor layer instead of the multi-layer film 306 was prepared. The structures of the other components are the same as those of Example Sample.

A 35-nm-thick In—Ga—Zn oxide film was used as the oxide semiconductor layer in Comparison Sample. The oxide semiconductor layer was formed by a sputtering method under the following conditions: a target having an atomic ratio of In:Ga:Zn=1:1:1 was used; an AC power of 5 kW was supplied; only oxygen was used as a deposition gas; the pressure was 0.6 Pa; and the substrate temperature was 170° C.

Since Comparison Sample has a single oxide semiconductor layer, the entire oxide semiconductor layer has a high current density. Therefore, the transistor is expected to have lower field-effect mobility than that of Example Sample because an effect of inhibiting carrier transfer at the interfaces between the gate insulating film 312 and the oxide semiconductor layer and between the oxide semiconductor layer and the protective insulating film 318 is likely to be caused.

The gate voltage (Vg)-drain current (Id) characteristics of Example Sample and Comparison Sample were measured. The transistor used for measurement of the electrical characteristic had a channel length (L) of 3 μm and a channel width (W) of 50 μm. The measurement of Vg-Id characteristics was performed by measuring drain current (Id) to gate voltage (Vg) when the drain voltage (Vd) was 1 V or 10 V. Further, the right axis indicates the field-effect mobility ($\mu_{RE}$) at the drain voltage (Vd) of 10 V. The gate voltage (Vg) was swept from −20 V to 15 V in increments of 0.25 V.

Figure 18:
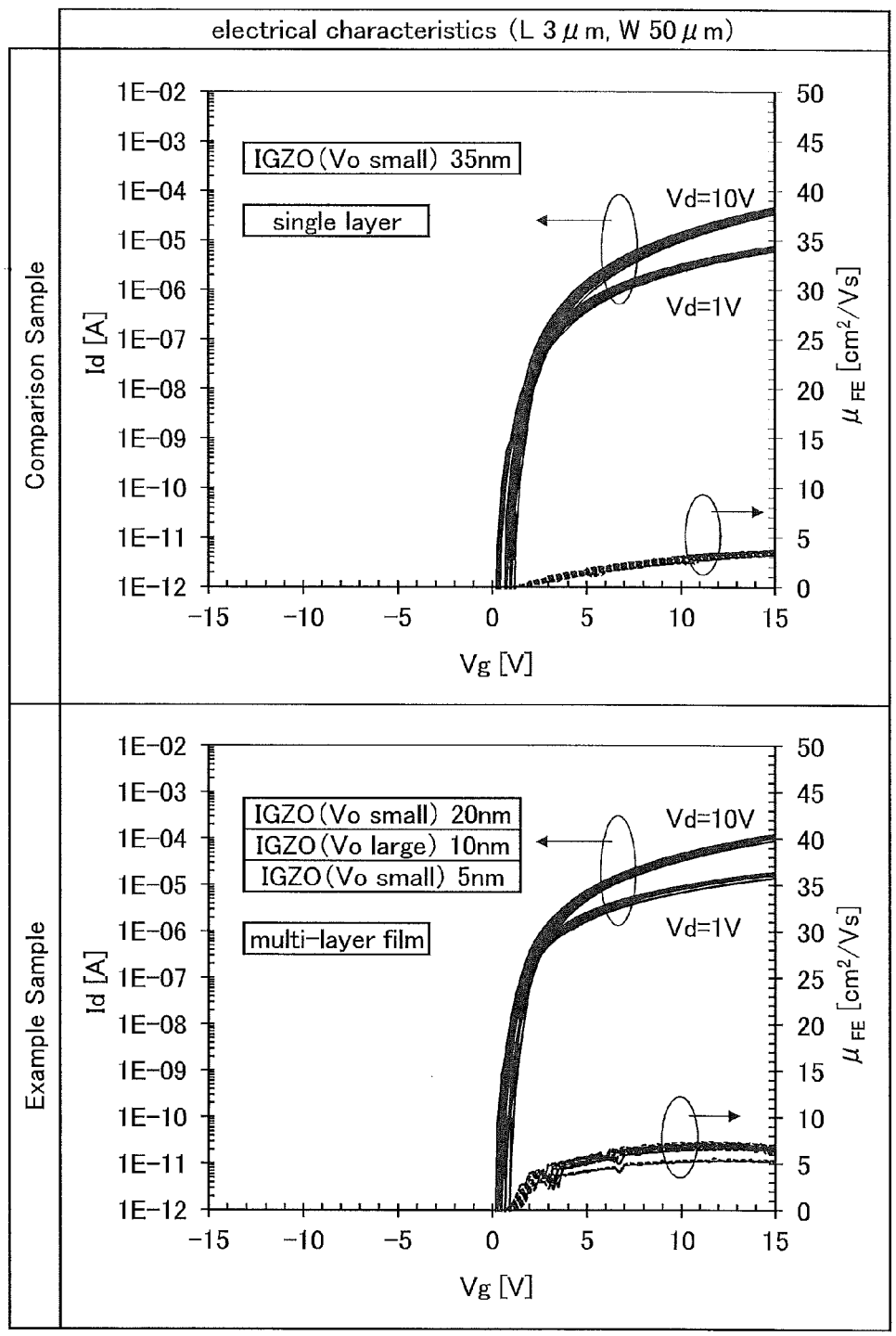
FIG. 18 is a graph showing electrical characteristics of transistors.

In each of Example Sample and Comparison Sample, the measurements of Vg-Id characteristics were performed 20 times at a drain voltage of 1 V and 20 times at a drain voltage of 10 V. The measurement results are shown in FIG. 18. In FIG. 18, the upper graph shows the electrical characteristics of Comparison Sample, and the lower graph shows the electrical characteristics of Example Sample.

From FIG. 18, Example Sample has a steeper rising of the Vg-Id characteristics than that of Comparison Sample. Further, Example Sample has larger on-state current and higher field-effect mobility than those of Comparison Sample at the same gate voltage (Vg).

Figure 19A:
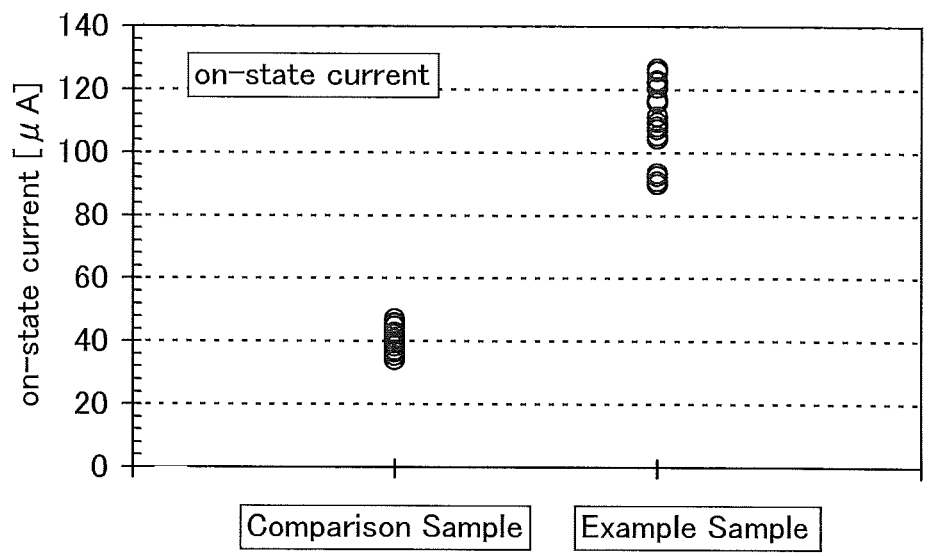
FIGS. 19A and 19B are graphs showing the on-state current and field-effect mobility of transistors.
Figure 19B:
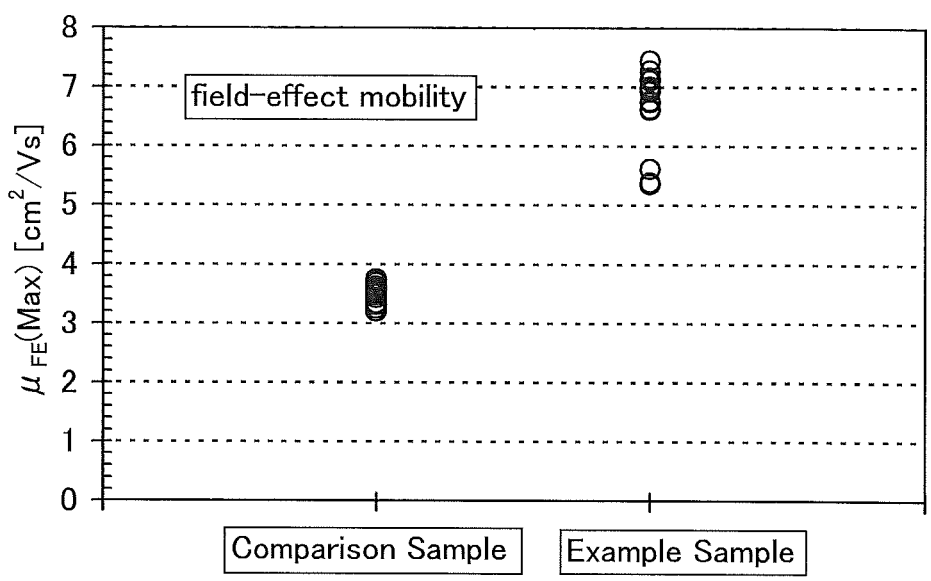

FIG. 19A shows the on-state current of Example Sample and Comparison Sample in the sweeping gate voltage (Vg) range. FIG. 19B shows the max values of field-effect mobility ($\mu_{FE}$(Max)) of Example Sample and Comparison Sample in the sweeping gate voltage (Vg) range.

From FIG. 19A, the on-state current of Example Sample is about 2 to 3 times that of Comparison Sample. From FIG. 19B, the field-effect mobility of Example Sample is about 1.5 to 2 times that of Comparison Sample.

Next, the reliability of Example Sample and Comparison Sample was evaluated. The reliability evaluation was performed by a gate BT stress test.

A measurement method in a positive gate BT stress test (positive BT) is described. To measure electrical characteristics in the initial state (a state before stress application) of the target transistors for the positive gate BT stress test, characteristics of change in drain current (Id) to the gate voltage (Vg), that is, Vg-Id characteristics were measured under the following conditions: the substrate temperature was 80° C. and the drain voltage (Vd) was 1 V or 10 V.

Next, the drain voltage (Vd) of the transistor was set to 0 V while the substrate temperature was held at 80° C. Then, the gate voltage (Vg) of +30 V was applied and held for 2000 seconds.

In a negative gate BT stress test (negative BT), the gate voltage (Vg) of −30 V was applied.

Figure 20:
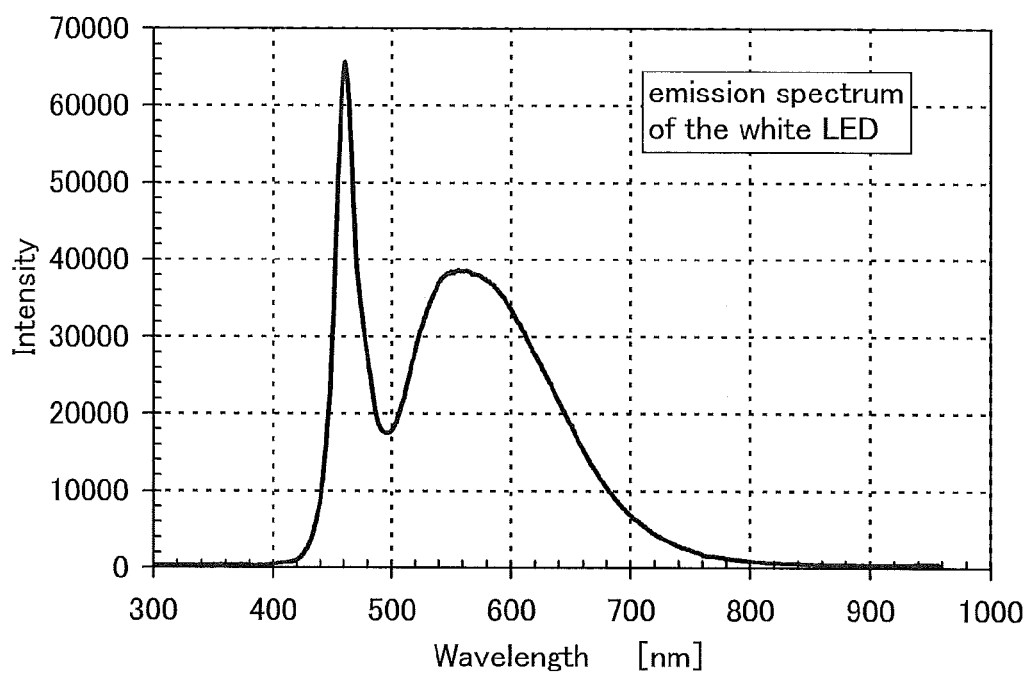
FIG. 20 shows an emission spectrum of the white LED.

The positive gate BT stress test and the negative gate BT stress test were performed in a dark state (dark) or a light state (photo). Note that in the light state, the transistors were irradiated with white LED light with 3000 lx. An emission spectrum of the white LED is shown in FIG. 20.

Figure 21:
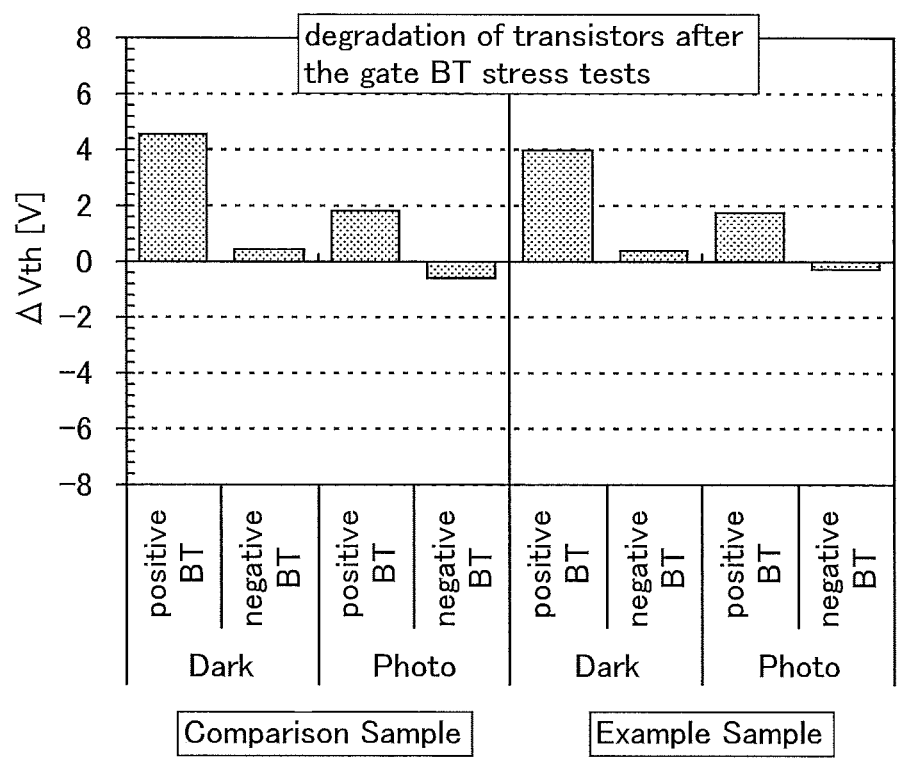
FIG. 21 shows degradation of transistors after the gate BT stress tests.

FIG. 21 shows the amount of change in threshold voltage (ΔVth) between before and after the gate BT stress tests of Example Sample and Comparison Sample. Note that the threshold voltage (Vth) refers to a gate voltage (voltage between a source and a gate) when a channel is formed. In a curve where the horizontal axis indicates the gate voltage (Vg) and the vertical axis indicates the square root of drain current (Id) and where data are plotted (Vg-√Id characteristics), the threshold voltage (Vth) was defined as a gate voltage (Vg) at a point of intersection of an extrapolated tangent line having the highest inclination with the square root of drain current (Id) of 0 (Id is 0 A).

From FIG. 21, it can be said that Example Sample and Comparison Sample each have a small amount of change in threshold voltage (ΔVth) between before and after the gate BT stress tests, and thus have high reliability.

This example shows that a transistor including a multi-layer film of one embodiment of the present invention has high field-effect mobility and high reliability.

This application is based on Japanese Patent Application serial No. 2013-038596 filed with Japan Patent Office on Feb. 28, 2013, the entire contents of which are hereby incorporated by reference.

What is claimed is:

1. A method for manufacturing a semiconductor device, the method comprising the steps of:
    forming a first oxide semiconductor layer; and
    forming a second oxide semiconductor layer so that the number of oxygen vacancies in the second oxide semiconductor layer is larger than the number of oxygen vacancies in the first oxide semiconductor layer,
    wherein the second oxide semiconductor layer is formed over and in contact with the first oxide semiconductor layer,
    wherein the first oxide semiconductor layer is formed by a sputtering method under a first atmosphere containing oxygen, and
    wherein the second oxide semiconductor layer is formed by a sputtering method under a second atmosphere having a lower concentration in oxygen than the first atmosphere.

2. The method for manufacturing a semiconductor device, according to claim 1, wherein the first oxide semiconductor layer and the second oxide semiconductor layer are formed using the same target.

3. The method for manufacturing a semiconductor device, according to claim 2, wherein an atomic ratio of an element in the first oxide semiconductor layer is different from an atomic ratio of the element in the second oxide semiconductor layer.

4. The method for manufacturing a semiconductor device, according to claim 1, further comprising the steps of:
    forming a gate insulating film in contact with the second oxide semiconductor layer; and
    forming a gate electrode in contact with the gate insulating film.

5. The method for manufacturing a semiconductor device, according to claim 1, wherein a proportion of oxygen in the second atmosphere is smaller than 10 volume %.

6. The method for manufacturing a semiconductor device, according to claim 1, wherein the first oxide semiconductor layer and the second oxide semiconductor layer are formed in the same deposition chamber.

7. A method for manufacturing a semiconductor device, the method comprising the steps of:
    forming a first oxide semiconductor layer;
    forming a second oxide semiconductor layer so that the number of oxygen vacancies in the second oxide semiconductor layer is larger than the number of oxygen vacancies in the first oxide semiconductor layer; and
    forming a third oxide semiconductor layer so that the number of oxygen vacancies in the third oxide semiconductor layer is smaller than the number of oxygen vacancies in the second oxide semiconductor layer,
    wherein the second oxide semiconductor layer is formed over and in contact with the first oxide semiconductor layer, wherein the third oxide semiconductor layer is formed over and in contact with the second oxide semiconductor layer, wherein the first oxide semiconductor layer is formed by a sputtering method under a first atmosphere containing oxygen, wherein the third oxide semiconductor layer is formed by a sputtering method under a second atmosphere containing oxygen, and wherein the second oxide semiconductor layer is formed by a sputtering method under a third atmosphere having a lower concentration in oxygen than the first atmosphere and the second atmosphere.

8. The method for manufacturing a semiconductor device, according to claim 7, wherein the first oxide semiconductor layer, the second oxide semiconductor layer and the third oxide semiconductor layer are formed using the same target.

9. The method for manufacturing a semiconductor device, according to claim 8, wherein an atomic ratio of an element in the first oxide semiconductor layer is different from an atomic ratio of the element in the second oxide semiconductor layer.

10. The method for manufacturing a semiconductor device, according to claim 7, further comprising the steps of:
   forming a gate insulating film in contact with the third oxide semiconductor layer; and
   forming a gate electrode in contact with the gate insulating film.

11. The method for manufacturing a semiconductor device, according to claim 7, wherein a proportion of oxygen in the third atmosphere is smaller than 10 volume %.

12. The method for manufacturing a semiconductor device, according to claim 7, wherein the first oxide semiconductor layer, the second oxide semiconductor layer and the third oxide semiconductor layer are formed in the same deposition chamber.

* * * * *